(12) United States Patent
Yamagishi et al.

(10) Patent No.: US 8,211,615 B2
(45) Date of Patent: Jul. 3, 2012

(54) COPOLYMER FOR IMMERSION LITHOGRAPHY AND COMPOSITIONS

(75) Inventors: Takanori Yamagishi, Ichihara (JP); Tomo Oikawa, Ichihara (JP); Takayoshi Okada, Ichihara (JP)

(73) Assignee: Maruzen Petrochemical Co., Ltd., Tokyo (JP)

( * ) Notice: Subject to any disclaimer, the term of this patent is extended or adjusted under 35 U.S.C. 154(b) by 369 days.

(21) Appl. No.: 12/445,948

(22) PCT Filed: Oct. 30, 2007

(86) PCT No.: PCT/JP2007/001183
§ 371 (c)(1),
(2), (4) Date: Apr. 17, 2009

(87) PCT Pub. No.: WO2008/056437
PCT Pub. Date: May 15, 2008

(65) Prior Publication Data
US 2010/0047710 A1    Feb. 25, 2010

(30) Foreign Application Priority Data

Nov. 7, 2006 (JP) .................................. 2006-301462

(51) Int. Cl.
*G03F 7/039* (2006.01)
*C08F 224/00* (2006.01)
*C08F 222/14* (2006.01)
*C08F 222/20* (2006.01)

(52) U.S. Cl. ............ 430/270.1; 430/326; 430/910; 430/914; 526/266; 526/270; 526/281; 526/282; 526/320; 526/328; 526/328.5

(58) Field of Classification Search .................. None
See application file for complete search history.

(56) References Cited

U.S. PATENT DOCUMENTS

| 4,491,628 A | 1/1985 | Ito et al. |
| 4,603,101 A | 7/1986 | Crivello |
| 6,180,316 B1 * | 1/2001 | Kajita et al. ............... 430/270.1 |
| 2003/0078352 A1 | 4/2003 | Miyazawa et al. |
| 2003/0186161 A1 * | 10/2003 | Fujimori ............... 430/270.1 |
| 2006/0040203 A1 * | 2/2006 | Kodama et al. ............ 430/270.1 |

FOREIGN PATENT DOCUMENTS

| JP | 59-45439 | 3/1984 |
| JP | 62-115440 | 5/1987 |
| JP | 5-113667 | 5/1993 |
| JP | 9-73173 | 3/1997 |
| JP | 9-90637 | 4/1997 |
| JP | 10-26828 | 1/1998 |
| JP | 10-161313 | 6/1998 |
| JP | 10-207069 | 8/1998 |
| JP | 2000-26446 | 1/2000 |
| JP | 2001-242627 | 9/2001 |
| JP | 2002 220416 | 8/2002 |
| JP | 2003 40840 | 2/2003 |
| JP | 2005-227332 | 8/2005 |
| JP | 2005 232095 | 9/2005 |
| JP | 2005-234015 | 9/2005 |
| JP | 2005-284238 | 10/2005 |
| JP | 2005-316259 | 11/2005 |
| JP | 2006 63318 | 3/2006 |
| JP | 2006-106497 | 4/2006 |

\* cited by examiner

*Primary Examiner* — Sin J. Lee
(74) *Attorney, Agent, or Firm* — Oblon, Spivak, McClelland, Maier & Neustadt, L.L.P.

(57) ABSTRACT

The present invention provides a copolymer which can prevent problems associated with immersion lithography (including occurrence of a pattern defect such as water mark, and variation in sensitivity or abnormal patterning due to elution of an additive such as a radiation-sensitive acid-generator) and which provides surface characteristics suitable for immersion lithography, and a composition containing the copolymer.

The copolymer for immersion lithography has, at least, a repeating unit (A) that generates an alkali-soluble group by removing protecting group through action of an acid, and a repeating unit (B) having a lactone structure, wherein, when a solution of the copolymer in propylene glycol monomethyl ether acetate (hereinafter may be abbreviated as "PGMEA") is applied to a wafer and then heated to form a thin film, and a 15-µL droplet of pure water is added onto the thin film, the inclination of the wafer at the time when the water droplet starts to move is 35° or less, or the contact angle of the top edge of the water droplet at the time when the water droplet starts to move is 64° or more.

8 Claims, No Drawings

COPOLYMER FOR IMMERSION LITHOGRAPHY AND COMPOSITIONS

CROSS-REFERENCE TO RELATED APPLICATIONS

This application is a 371 of PCT/JP07/001,183 filed Oct. 30, 2007 and claims the benefit of JP 2006-301462 filed Nov. 7, 2006.

TECHNICAL FIELD

The present invention relates to a copolymer for immersion lithography which is employed for the production of a semiconductor, and to a composition for immersion lithography containing the copolymer. More particularly, the present invention relates to a copolymer suitable for the formation of micropatterns on, for example, a resist film through immersion lithography employing far-ultraviolet radiation such as KrF excimer laser or ArF excimer laser; and to a composition containing the copolymer.

BACKGROUND ART

Production of semiconductor devices requires formation of finer lithography patterns for increasing the degree of integration. For forming lithographic micropatterns, use of a radiation (light) source of short wavelength (as used herein, "light" refers to a type of radiation) is a key technique. In addition to g-rays and i-rays, which have hitherto been used, far-ultraviolet radiations such as a krypton fluoride (KrF) excimer laser radiation (wavelength: 248 nm) and an argon fluoride (ArF) excimer laser radiation (wavelength: 193 nm) have been introduced for mass production of semiconductor devices. Meanwhile, studies have been conducted on lithography techniques employing, as a radiation source, a fluorine dimer ($F_2$) excimer laser radiation (157 nm), an extreme ultraviolet radiation (EUV), an electron beam (EB), or the like.

Such a lithography technique suitably uses a positive chemical amplification-type copolymer for lithography. Such a copolymer has a repeating unit having a structure including a polar group that can be dissolved in an alkaline developer (hereinafter the group may be referred to as an "alkali-soluble group"), the alkali-soluble group being protected by a substituent group that is unstable to acid and inhibits solubility in an alkaline developer (hereinafter the group may be referred to as an "acid-dissociable dissolution-inhibitive group"); and a repeating unit having a polar group for enhancing the adhesion of the copolymer to, for example, a semiconductor substrate, or regulating the solubility of the copolymer in a solvent for lithography or an alkaline developer.

For example, as has been known, a lithography technique using KrF excimer laser as an exposure light source employs, for example, a copolymer having a repeating unit derived from hydroxystyrene; and a repeating unit in which a phenolic hydroxyl group derived from hydroxystyrene is protected by an acid-dissociable dissolution-inhibitive group (e.g., an acetal structure or a tertiary hydrocarbon group), or a repeating unit in which a carboxyl group derived from (α-alkyl)acrylate is protected by an acid-dissociable dissolution-inhibitive group (e.g., an acetal structure or a quaternary hydrocarbon group) (see, for example, Patent Documents 1 to 4). There has also been known a copolymer having a repeating unit in which an alicyclic hydrocarbon group serves as an acid-dissociable dissolution-inhibitive group for increasing the dry etching resistance of the copolymer or the difference in rate of dissolution of the copolymer in an alkaline developer between before and after light exposure (see, for example, Patent Documents 5 and 6).

In a lithography technique using, for example, ArF excimer laser of shorter wavelength as an exposure light source, attempts have been made to employ a copolymer which does not have a hydroxystyrene-derived repeating unit exhibiting high absorption coefficient with respect to a wavelength of 193 nm. As has been known, such a lithography technique employs a copolymer having a repeating unit having a lactone structure as a polar group for enhancing the adhesion of the copolymer to, for example, a semiconductor substrate, or regulating the solubility of the copolymer in a solvent for lithography or an alkaline developer (see, for example, Patent Documents 7 to 10).

In recent years, immersion lithography has been proposed. This is a technique in which light exposure is carried out by introducing, between an objective lens and a lithography thin film, a liquid exhibiting a refractive index higher than that of air (e.g., water). As compared with the case of a conventional lithography technique in which an air layer is present between an objective lens and a thin film (hereinafter the technique may be referred to as "dry lithography"), immersion lithography enables finer lithography patterns to be formed by means of a light source having the same wavelength as that of a light source used in dry lithography, since the numerical aperture of a lens can be increased even when a light source of the same wavelength is employed, and the depth of focus can be increased even when a lens of the same numerical aperture is employed. Therefore, studies have been actively conducted on immersion lithography employing ArF excimer laser as a light source and, in particular, water as an immersion liquid, so that the lithography can be put into practice as a next-generation lithography technique. The copolymer proposed to be employed in such ArF immersion lithography is the same as that known in conventional ArF dry lithography techniques (see, for example, Patent Documents 11 to 13).

However, the aforementioned known copolymers may raise problems, due to its high water wettability. Specifically, when water is introduced between an objective lens and a film which is formed of the copolymer and is exposed to light, after the objective lens has been moved on the film together with water, water droplets remain on the film, which may cause a pattern defect called "water mark." In addition, the remaining water droplets may enter the film to elute an additive such as a radiation-sensitive acid-generator, causing variation in sensitivity or abnormal patterning.

Meanwhile, for reduction of problematic variations in line width of lithography patterns during formation of fine patterns, there has been proposed a copolymer having a structure in which an alcoholic hydroxyl group derived from a hydroxycycloalkyl (α-lower alkyl)acrylate is protected by an alkoxyalkyl group (Patent Document 14). The copolymer disclosed in this patent document has a particularly preferred structure in which an alcoholic hydroxyl group is protected by an acetal bond, and only such a structure is described in examples of the document. However, such a structure is very unstable to water or heat, and cannot be used in immersion lithography.

Thus, there has never been known a copolymer which is suitable for lithography employing ArF excimer laser as an exposure light source, which has a repeating unit having a structure in which an alkali-soluble group is protected by an acid-dissociable dissolution-inhibitive group and a repeating unit having a lactone structure, and which exhibits excellent surface characteristics suitable for immersion lithography (e.g., water removability or water repellency represented by the falling angle or sweepback angle of water).
Patent Document 1: JP-A-1984-045439
Patent Document 2: JP-A-1993-113667
Patent Document 3: JP-A-1998-026828
Patent Document 4: JP-A-1987-115440
Patent Document 5: JP-A-1997-073173
Patent Document 6: JP-A-1998-161313
Patent Document 7: JP-A-1997-090637
Patent Document 8: JP-A-1998-207069
Patent Document 9: JP-A-2000-026446
Patent Document 10: JP-A-2001-242627
Patent Document 11: JP-A-2005-227332
Patent Document 12: JP-A-2005-234015
Patent Document 13: JP-A-2005-316259
Patent Document 14: JP-A-2006-106497

DISCLOSURE OF THE INVENTION

Problems to be Solved by the Invention

In view of the foregoing, an object of the present invention is to provide a copolymer which can prevent problems associated with immersion lithography (including occurrence of a pattern defect such as water mark, and variation in sensitivity or abnormal patterning due to elution of an additive such as a radiation-sensitive acid-generator) and which provides surface characteristics suitable for immersion lithography. Another object of the present invention is to provide a composition containing the copolymer.

Means for Solving the Problems

In order to achieve the aforementioned objects, the present inventors have conducted extensive studies, and as a result have found that these objects can be attained by a copolymer which has a repeating unit (A) that generates an alkali-soluble group by removing a protecting group through the action of an acid, and a repeating unit (B) having a lactone structure, wherein, when the copolymer is formed into a thin film, the thin film exhibits specific surface characteristics, as well as by a composition for lithography containing the copolymer. The present invention has been accomplished on the basis of this finding.

Accordingly, the present invention provides a copolymer for immersion lithography, having, at least, a repeating unit (A) that generates an alkali-soluble group by removing a protecting group through the action of an acid, and a repeating unit (B) having a lactone structure, wherein, when a solution of the copolymer in propylene glycol monomethyl ether acetate (hereinafter may be abbreviated as "PGMEA") is applied to a wafer and then heated to form a thin film, and a 15-μL droplet of pure water is added onto the thin film, the inclination of the wafer at the time when the water droplet starts to move (hereinafter the inclination may be referred to as a "falling angle") is 35° or less.

The present invention also provides a copolymer for immersion lithography, having, at least, a repeating unit (A) that generates an alkali-soluble group by removing a protecting group through the action of an acid, and a repeating unit (B) having a lactone structure, wherein, when a solution of the copolymer in propylene glycol monomethyl ether acetate (hereinafter may be abbreviated as "PGMEA") is applied to a wafer and then heated to form a thin film, and a 15-μL droplet of pure water is added onto the thin film, the contact angle of the top edge of the water droplet at the time when the water droplet starts to move (hereinafter the angle may be referred to as a "sweepback angle") is 64° or more.

The present invention also provides a composition for immersion lithography containing at least the aforementioned copolymer, a radiation-sensitive acid-generator, and a solvent.

Effects of the Invention

When the copolymer or composition of the present invention is employed in immersion lithography, problems associated therewith (e.g., occurrence of a pattern defect such as water mark, variation in sensitivity, and abnormal patterning) can be avoided. Therefore, fine lithography patterns can be reliably formed, and a semiconductor device of high integration can be produced at high yield.

BEST MODES FOR CARRYING OUT THE INVENTION

The present invention will next be described in more detail.

The copolymer for immersion lithography of the present invention has, at least, a repeating unit (A) and a repeating unit (B). When the copolymer is formed into a thin film, the thin film exhibits specific surface characteristics. Preferably, the copolymer further has a repeating unit (C) that generates an alcoholic hydroxyl group by removing a protecting group having a specific structure through action of an acid. The copolymer may optionally have, for example, a repeating unit (D) and a repeating unit (E).

1. Structure of Copolymer
(1) Repeating Unit (A)

The repeating unit (A) is a repeating unit that generates an alkali-soluble group by removing a protecting group through action of an acid. The alkali-soluble group is preferably a polar group having a pKa of 12 or less in water at 25° C., particularly preferably a polar group having a pKa of 11 or less in water at 25° C. Examples of such a polar group include a phenolic hydroxyl group, a fluoroalcoholic hydroxyl group, a carboxyl group, and a sulfo group. Among them, a carboxyl group is particularly preferred, from the viewpoints of, for example, light transmittance at 193 nm and preservation stability. An acid-dissociable dissolution-inhibitive group is substituted with hydrogen of such an alkali-soluble group, and bonded to the corresponding oxygen atom, to thereby inhibit solubility of the copolymer in an alkaline developer.

The repeating unit (A) particularly preferably has a structure represented by the following formula (A1).

$$\text{(A1)}$$

In formula (A1), $R_{20}$ represents a hydrogen atom or a C1-C4 hydrocarbon group which may be substituted by a fluorine atom; specifically, a hydrogen atom or a C1-C4 alkyl group which may be substituted by a fluorine atom, such as methyl, ethyl, n-propyl, i-propyl, n-butyl, i-butyl, or trifluoromethyl. $R_{20}$ is preferably a hydrogen atom, a methyl group, or a trifluoromethyl group.

In formula (A1), $R_{21}$ represents a C6-C12 alicyclic hydrocarbon group which may include an oxygen atom or a sulfur atom, and is preferably a C6-C12 saturated alicyclic hydrocarbon group which may include an oxygen atom or a sulfur atom; specifically, an alicyclic hydrocarbon group having, for example, a norbornane ring, a 7-oxa-norbornane ring, a 7-thia-norbornane ring, or a tetracyclo[4.4.0.1$^{2,5}$.1$^{7,10}$]dodecane ring. $R_{21}$ is preferably an alicyclic hydrocarbon group having a norbornane ring or a tetracyclo[4.4.0.1$^{2,5}$.1$^{7,10}$] dodecane ring.

In formula (A1), b is an integer of 0 or 1, and $R_{22}$ represents an acid-dissociable group represented by the following formula (a1) or (a2).

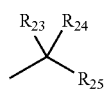
(a1)

In formula (a1), $R_{23}$ and $R_{24}$ each independently represent a C1-C4 hydrocarbon group; specifically, a C1-C4 alkyl group such as methyl, ethyl, n-propyl, i-propyl, n-butyl, or i-butyl. $R_{25}$ represents a C1-C12 hydrocarbon group; specifically, a C1-C12 linear, branched, or cyclic alkyl group, such as methyl, ethyl, n-propyl, i-propyl, n-butyl, i-butyl, cyclopentyl, cyclohexyl, norbornyl, tricyclo[5.2.1.0$^{2,6}$]decanyl, adamantyl, or tetracyclo[4.4.0.1$^{2,5}$.1$^{7,10}$]dodecanyl. $R_{25}$ may be bonded to $R_{23}$ or $R_{24}$ to form a ring; specifically, a saturated ring such as a cyclopentane ring, a cyclohexane ring, a norbornane ring, a tricyclo[5.2.1.0$^{2,6}$]decane ring, an adamantane ring, or a tetracyclo[4.4.0.1$^{2,5}$.1$^{7,10}$]dodecane ring.

Particularly when $R_{25}$ is bonded to $R_{23}$ or $R_{24}$ to form a ring; specifically, a C5-C20 saturated ring such as a cyclopentane ring, a cyclohexane ring, a norbornane ring, a tricyclo[5.2.1.0$^{2,6}$]decane ring, an adamantane ring, or a tetracyclo[4.4.0.1$^{2,5}$.1$^{7,10}$]dodecane ring, the copolymer shows a great difference in solubility in an alkaline developer between before and after lithography, which is preferred for forming fine patterns.

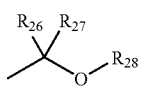
(a2)

In formula (a2), $R_{26}$ and $R_{27}$ each independently represent a hydrogen atom or a C1-C4 hydrocarbon group; specifically, a hydrogen atom or a C1-C4 alkyl group such as methyl, ethyl, n-propyl, i-propyl, n-butyl, or i-butyl. $R_{28}$ represents a C1-C12 hydrocarbon group and is preferably a C1-C12 saturated hydrocarbon group; specifically, a C1-C12 linear, branched, or cyclic alkyl group, such as methyl, ethyl, n-propyl, i-propyl, n-butyl, i-butyl, t-butyl, 2-ethylhexyl, cyclopentyl, cyclohexyl, norbornyl, tricyclo[5.2.1.0$^{2,6}$]decanyl, adamantyl, or tetracyclo[4.4.0.1$^{2,5}$.1$^{7,10}$]dodecanyl. $R_{26}$ may be bonded to $R_{27}$ or $R_{28}$ to form a ring. Specific examples of the ring formed through bonding between $R_{26}$ and $R_{27}$ include C5-C20 saturated rings such as a cyclopentane ring, a cyclohexane ring, a norbornane ring, a tricyclo[5.2.1.0$^{2,6}$]decane ring, an adamantane ring, and a tetracyclo[4.4.0.1$^{2,5}$.1$^{7,10}$] dodecane ring. Specific examples of the ring formed through bonding between $R_{26}$ and $R_{28}$ include C4-C8 oxygen-containing saturated heterocyclic rings such as a hydrofuran ring and a hydropyran ring.

Specific examples of the repeating unit (A) will be described below. However, the present invention is not limited to these examples. The present invention may employ a single type of the repeating unit (A) or a plurality of types of the repeating unit (A) having different structures.

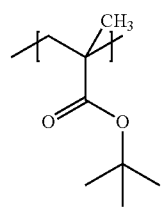
(B101)

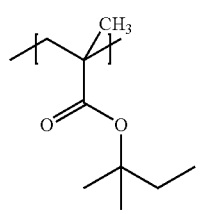
(B102)

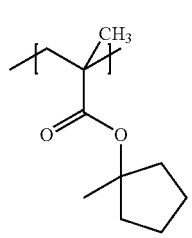
(B103)

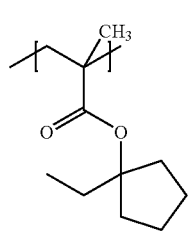
(B104)

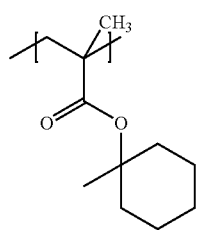
(B105)

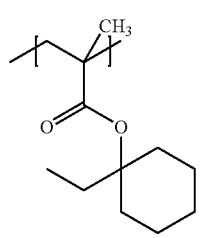
(B106)

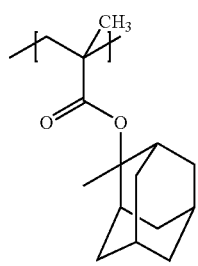
(B107)
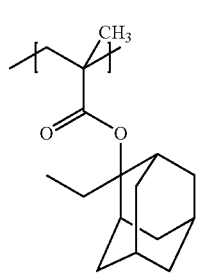
(B108)
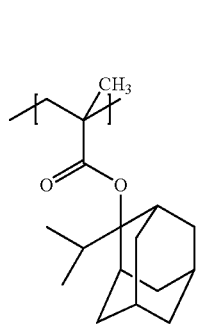
(B109)
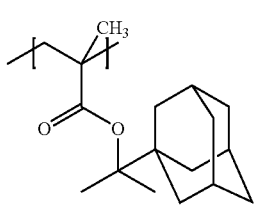
(B110)
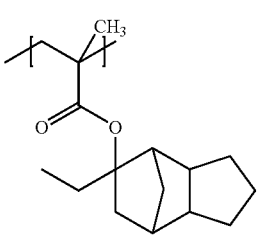
(B111)
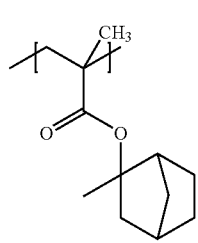
(B112)
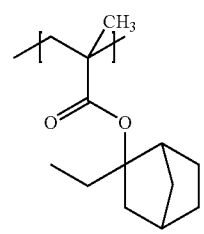
(B113)
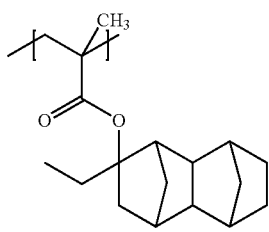
(B114)
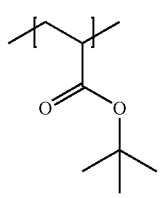
(B121)
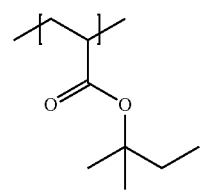
(B122)
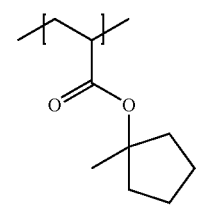
(B123)
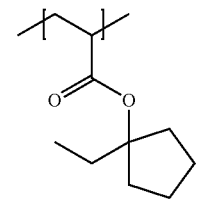
(B124)
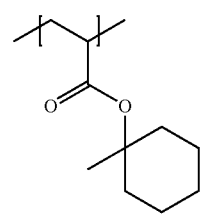
(B125)

(B126) 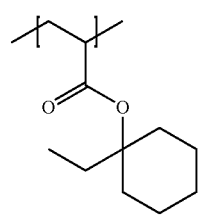
(B127) 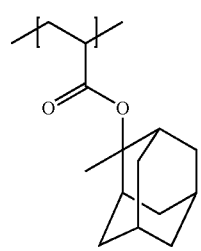
(B128) 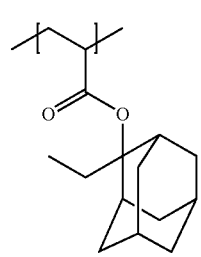
(B129) 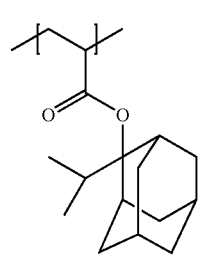
(B130) 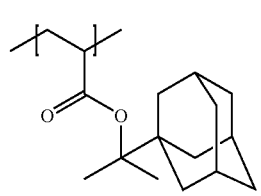
(B131) 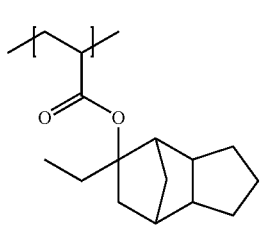
(B132) 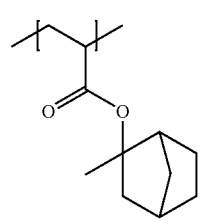
(B133) 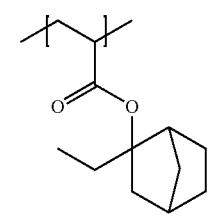
(B134) 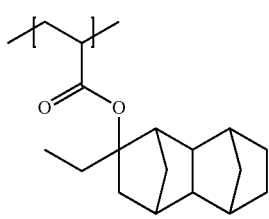
(B141) 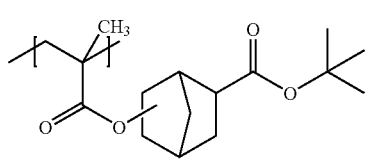
(B142) 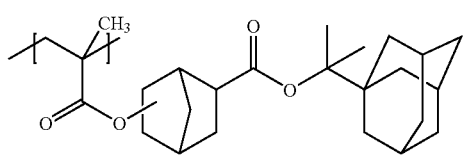
(B143) 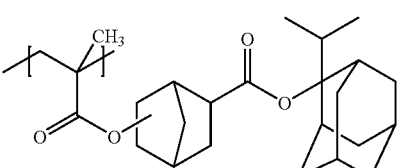
(B144) 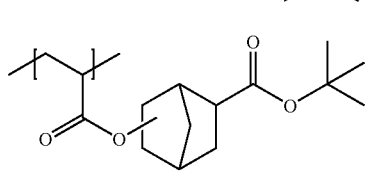
(B151) 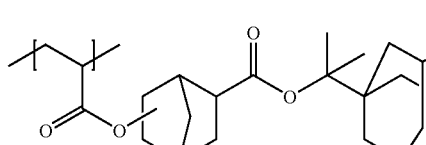
(B152) 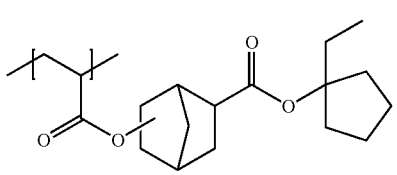
(B153) 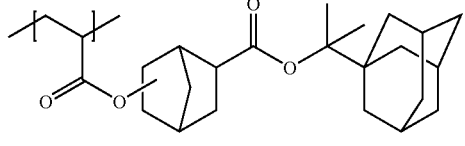

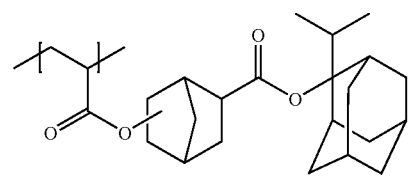
(B154)
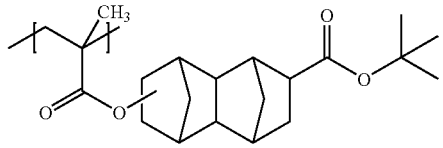
(B161)
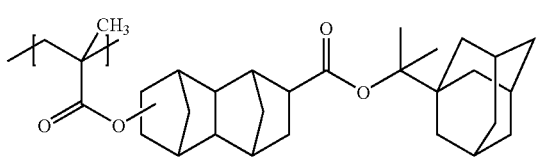
(B162)
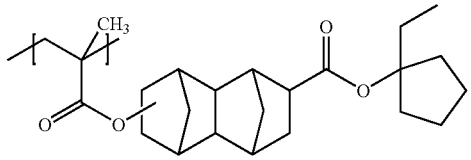
(B163)
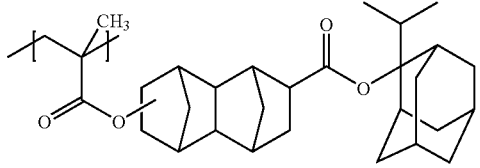
(B164)
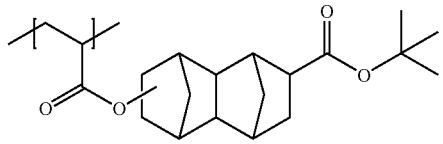
(B171)
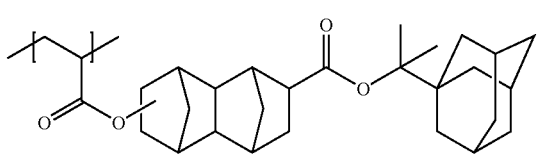
(B172)
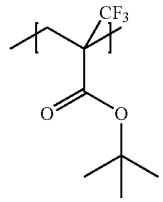
(B181)
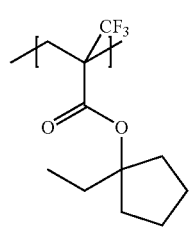
(B182)
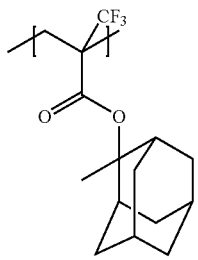
(B183)
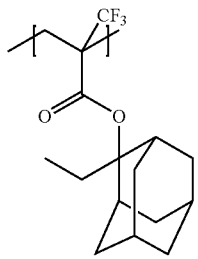
(B184)
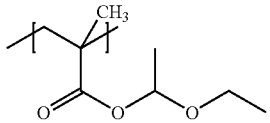
(B201)
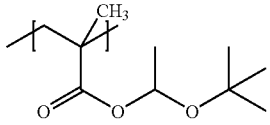
(B202)
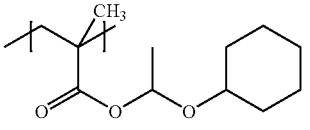
(B203)
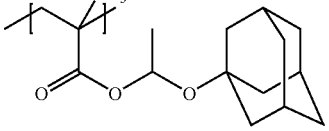
(B204)
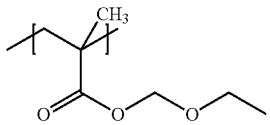
(B205)
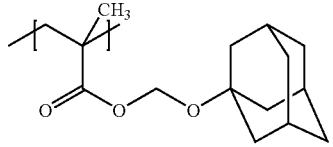
(B206)
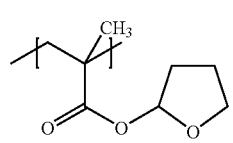
(B207)

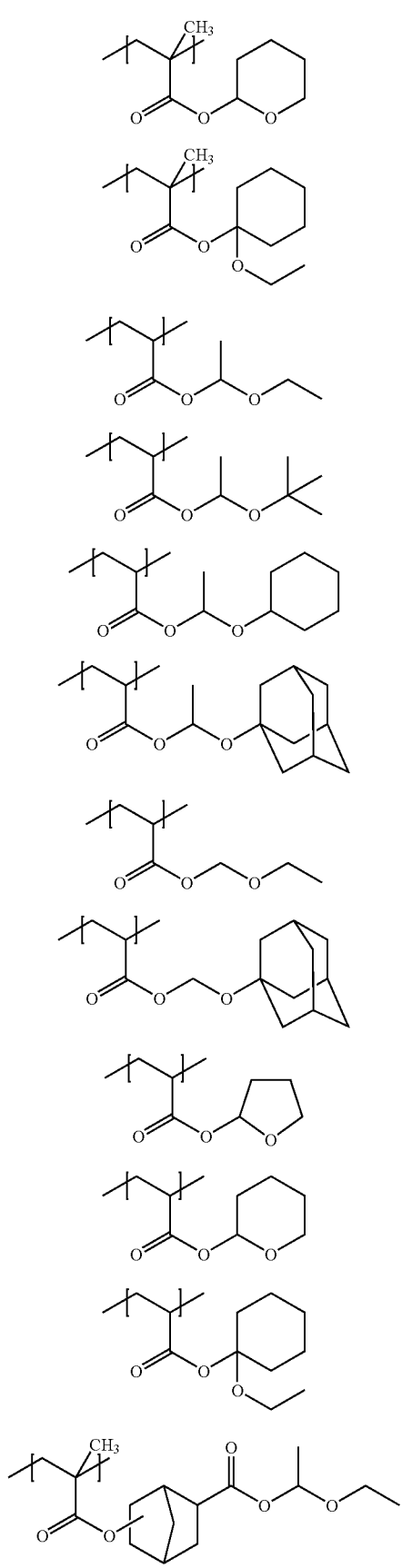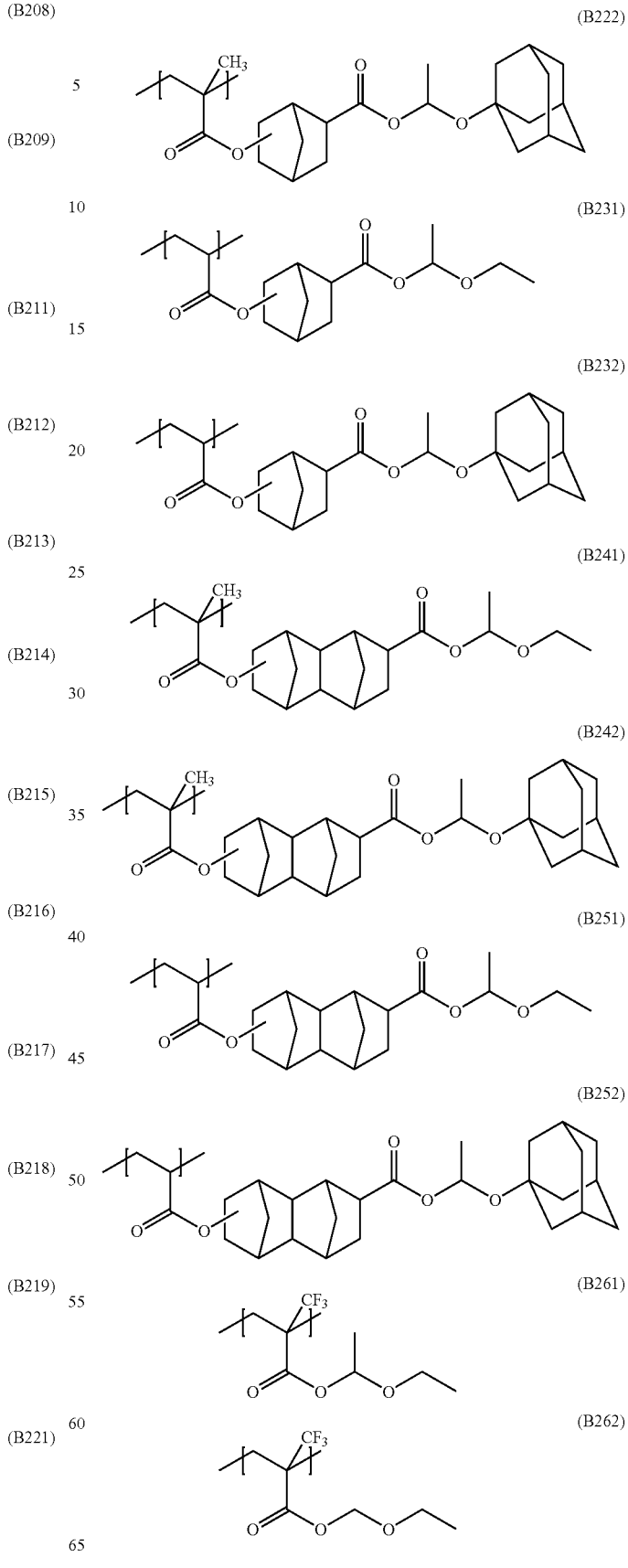

-continued

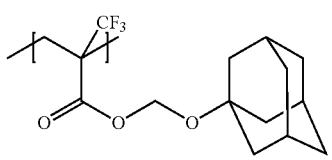
(B263)

(2) Repeating Unit (B)

The repeating unit (B) is a repeating unit having a lactone structure. The repeating unit (B) enhances the adhesion of the copolymer to a substrate or a underlying film, and controls the solubility of the copolymer in a solvent for lithography or an alkaline developer. The repeating unit (B) particularly preferably has a structure represented by the following formula (B1).

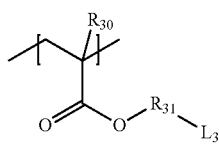
(B1)

In formula (B1), $R_{30}$ represents a hydrogen atom or a C1-C4 hydrocarbon group which may be substituted by a fluorine atom; specifically, a hydrogen atom or a C1-C4 alkyl group which may be substituted by a fluorine atom, such as methyl, ethyl, n-propyl, i-propyl, n-butyl, i-butyl, or trifluoromethyl. $R_{30}$ is preferably a hydrogen atom, a methyl group, or a trifluoromethyl group. $R_{31}$ represents a single bond or a C5-C12 alicyclic hydrocarbon group which may include an oxygen atom or a sulfur atom; specifically, a single bond or a saturated alicyclic hydrocarbon group having, for example, a cyclohexane ring, a norbornane ring, a 7-oxa-norbornane ring, a 7-thia-norbornane ring, or a tetracyclo[4.4.0.1$^{2,5}$.1$^{7,10}$]dodecane ring. $R_{31}$ is preferably a single bond, or a saturated alicyclic hydrocarbon group having a norbornane ring or a 7-oxa-norbornane ring.

In formula (B1), $L_3$ represents a lactone structure represented by the following formula (b1) and is bonded to $R_{31}$ by one or two single bonds.

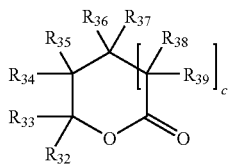
(b1)

In formula (b1), any one of $R_{32}$ to $R_{39}$ represents a single bond having a binding site of $R_{31}$, and the remaining ones of $R_{32}$ to $R_{39}$ each represent a hydrogen atom or a C1-C4 hydrocarbon or alkoxy group. Alternatively, any one of $R_{32}$ to $R_{39}$ represents a C3-C12 hydrocarbon group which may include an oxygen atom or a sulfur atom, the hydrocarbon group having a binding site of $R_{31}$ and being bonded to any one or two of the remaining ones of $R_{32}$ to $R_{39}$ to form a C5-C15 alicyclic ring; any one or two of the remaining ones of $R_{32}$ to $R_{39}$ represent a single bond for forming the aforementioned C5-C15 alicyclic ring; and the further remaining ones of $R_{32}$ to $R_{39}$ each represent a hydrogen atom or a C1-C4 hydrocarbon or alkoxy group.

In formula (b1), c is an integer of 0 or 1.

Examples of the C1-C4 hydrocarbon group include C1-C4 alkyl groups such as methyl, ethyl, n-propyl, and i-propyl.

Specific examples of the repeating unit (B) will be described below. However, the present invention is not limited to these examples. The present invention may employ a single type of the repeating unit (B) or a plurality of types of the repeating unit (B) having different structures.

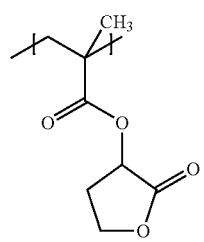
(C101)

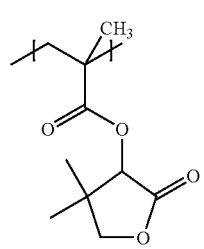
(C102)

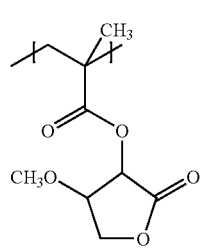
(C103)

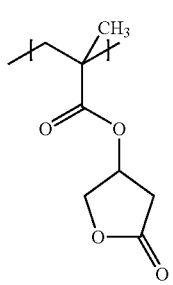
(C104)

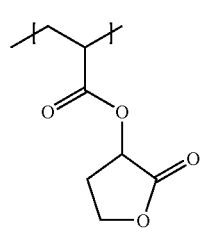
(C105)

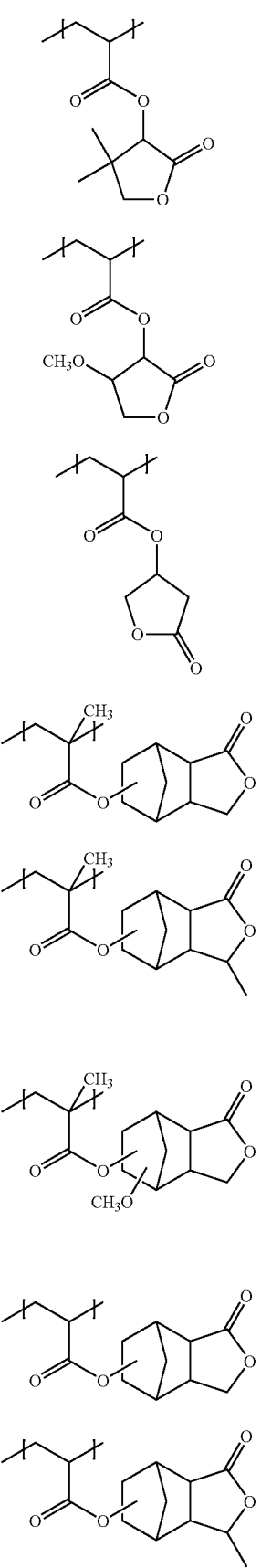
(C106)
(C107)
(C108)
(C111)
(C112)
(C113)
(C115)
(C116)
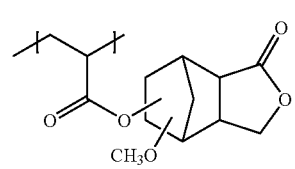
(C117)
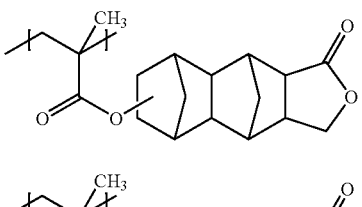
(C121)
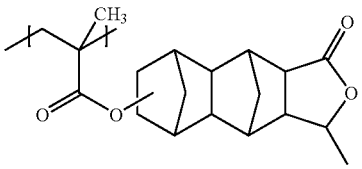
(C122)
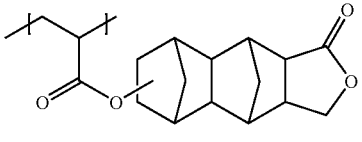
(C125)
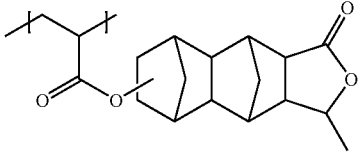
(C126)
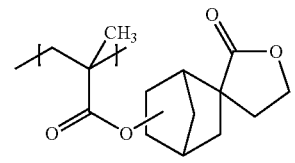
(C131)
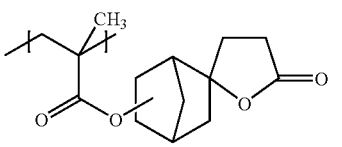
(C132)
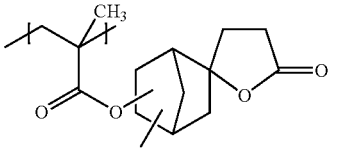
(C133)
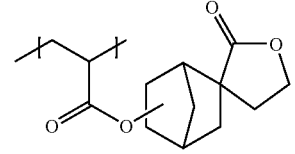
(C135)
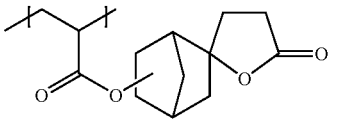
(C136)

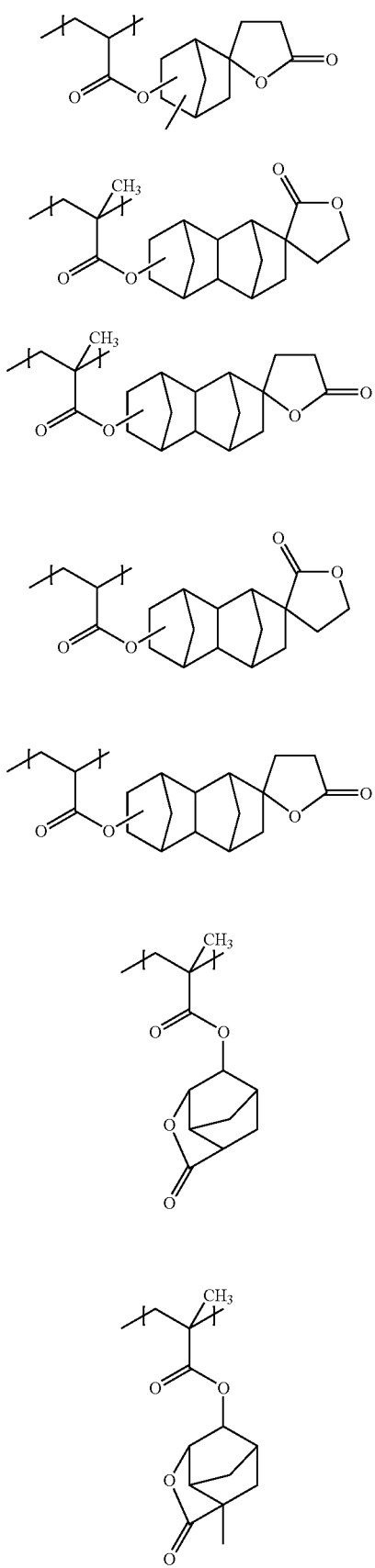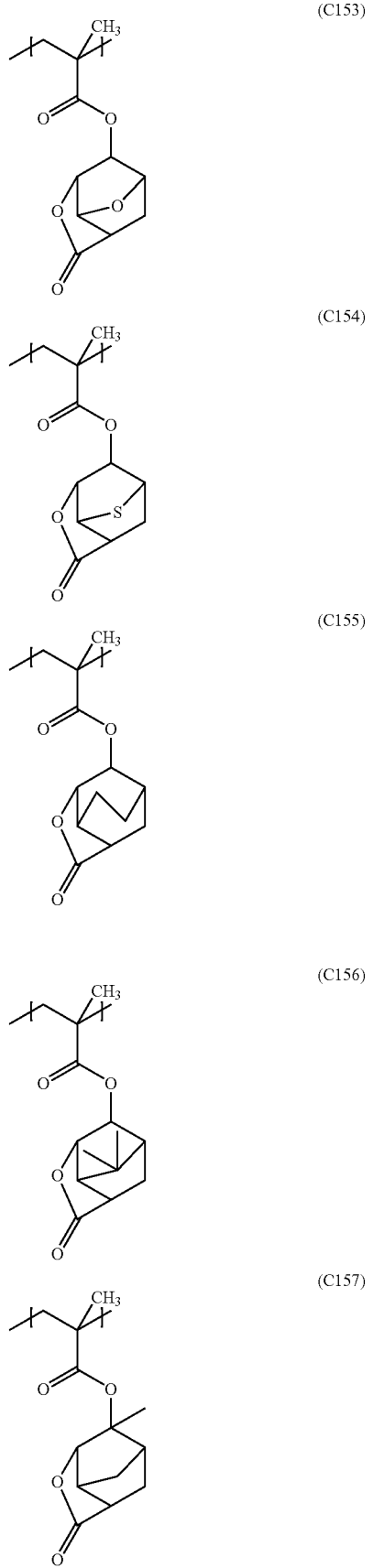

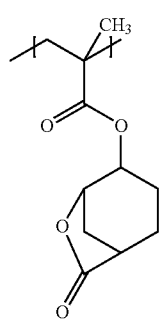 (C158)
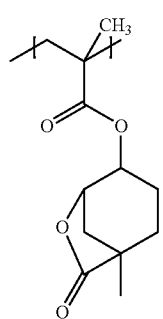 (C159)
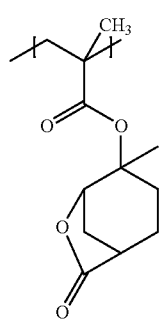 (C160)
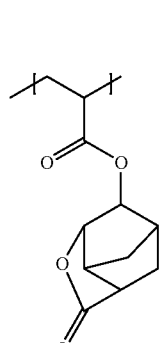 (C171)
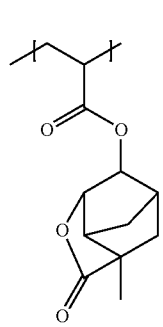 (C172)
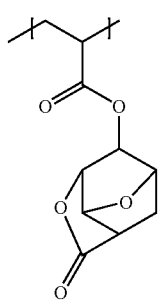 (C173)
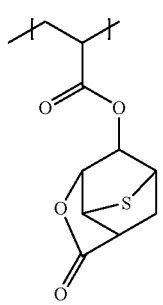 (C174)
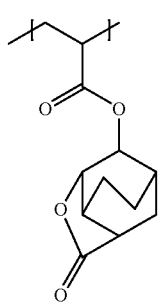 (C175)
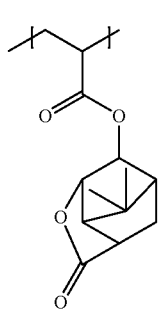 (C176)
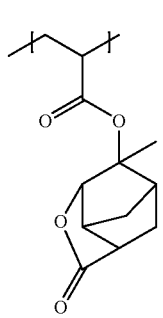 (C177)

(C178)

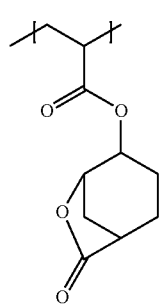

(C179)

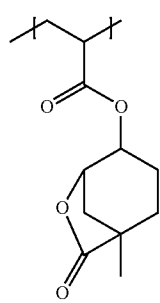

(C180)

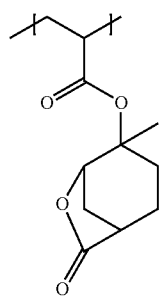

(3) Repeating Unit (C)

The repeating unit (C) is a repeating unit that generates an alcoholic hydroxyl group by removing a protecting group through action of an acid. When the copolymer is formed into a thin film for lithography, by virtue of the repeating unit (C), the film maintains good water removability upon immersion and light exposure. When the film is baked after light exposure, a protecting group at the light-exposed site is removed, and affinity for an alkaline developer is increased. Thus, the repeating unit (C) realizes prevention of problems associated with immersion lithography (including occurrence of a pattern defect such as water mark, and variation in sensitivity or abnormal patterning due to elution of an additive such as a radiation-sensitive acid-generator), as well as formation of micropatterns.

The repeating unit (C) is represented by the following formula (C1).

(C1)

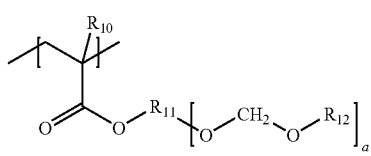

In formula (C1), $R_{10}$ represents a hydrogen atom or a C1-C4 hydrocarbon group which may be substituted by a fluorine atom; specifically, a hydrogen atom or a C1-C4 alkyl group such as methyl, ethyl, n-propyl, i-propyl, n-butyl, i-butyl, or trifluoromethyl. $R_{10}$ is preferably a hydrogen atom, a methyl group, or a trifluoromethyl group. $R_{11}$ represents a C2-C12 di- to tetra-valent hydrocarbon group which may be substituted by a hydroxyl group, and is preferably a C2-C12 linear, branched, or cyclic alkylene group. Specific examples include the below-described structures. In the below-described structures, o represents a binding site of $R_{11}$ or a hydroxyl group. In each structure, at least two sites represented by o are linkage sites.

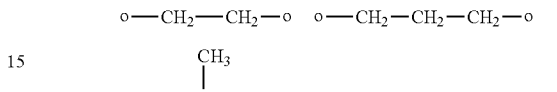

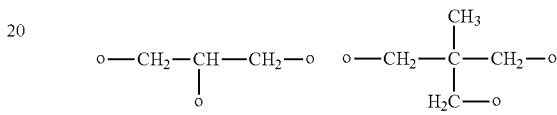

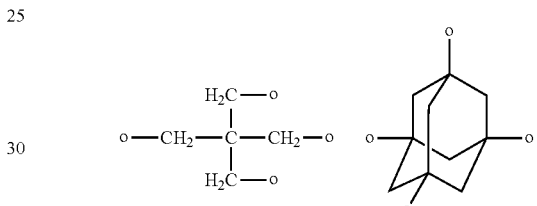

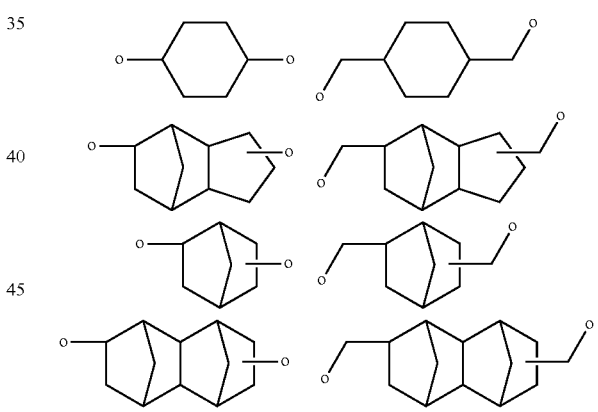

In formula (C1), a is an integer from 1 to 3. $R_{12}$ represents a C1-C15 hydrocarbon group; specifically, a linear or branched alkyl group such as methyl, ethyl, n-propyl, i-propyl, n-butyl, i-butyl, or t-butyl, or a saturated alicyclic hydrocarbon group having, for example, a cyclopentane ring, a cyclohexane ring, a norbornane ring, an isobornane ring, a tricyclo[5.2.1.0$^{2,6}$]decane ring, an adamantane ring, or a tetracyclo[4.4.0.1$^{2,5}$.1$^{7,10}$]dodecane ring. $R_{12}$ is particularly preferably a cyclopentyl group, a cyclohexyl group, a norbornyl group, an isobornyl group, a tricyclo[5.2.1.0$^{2,6}$]decanyl group, an adamantyl group, or a tetracyclo[4.4.0.1$^{2,5}$.1$^{7,10}$]dodecanyl group.

Among the repeating units represented by formula (C1), a repeating unit represented by the following formula (C2) is particularly preferred.

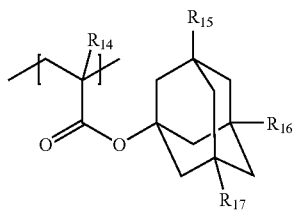
(C2)

In formula (C2), $R_{14}$ represents a hydrogen atom or a C1-C4 hydrocarbon group which may be substituted by a fluorine atom; specifically, a hydrogen atom or a C1-C4 alkyl group such as methyl, ethyl, n-propyl, i-propyl, n-butyl, i-butyl, or trifluoromethyl. $R_{14}$ is preferably a hydrogen atom, a methyl group, or a trifluoromethyl group. $R_{15}$ to $R_{17}$ each represent a hydrogen atom, a hydroxyl group, or a substituent represented by the following formula (c1), and at least one of $R_{15}$ to $R_{17}$ is a substituent represented by the following formula (c1).

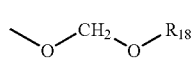
(c1)

In formula (c1), $R_{18}$ represents a C1-C15 hydrocarbon group. Specific examples include the same as those described above in $R_{12}$ of formula (C1).

Specific examples of the repeating unit (C) will be described below. However, the present invention is not limited to these examples. The present invention may employ a single type of the repeating unit (C) or a plurality of types of the repeating unit (C) having different structures.

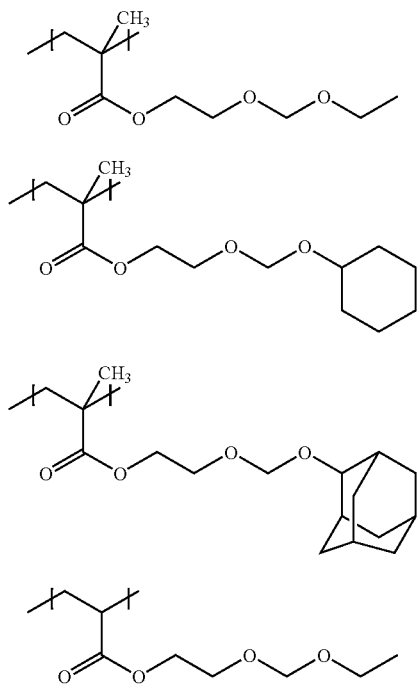

(A001)

(A002)

(A003)

(A011)

-continued

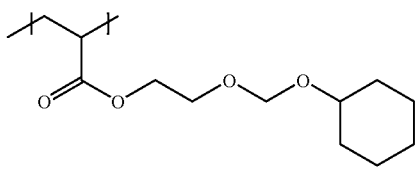
(A012)

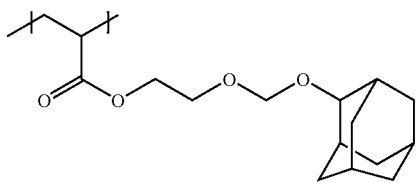
(A113)

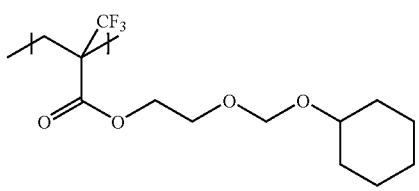
(A022)

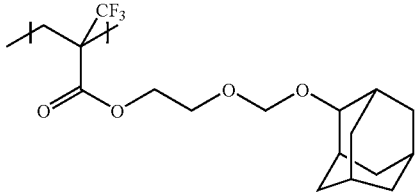
(A023)

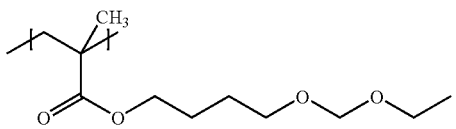
(A031)

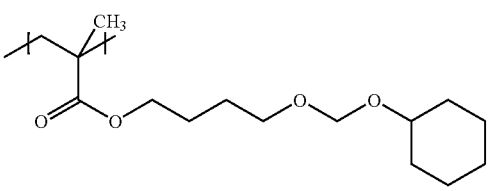
(A032)

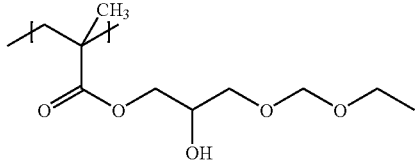
(A041)

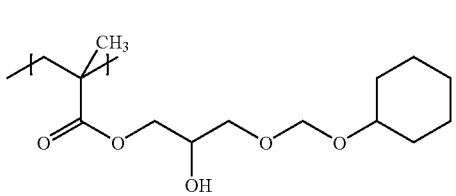
(A042)

(A045) 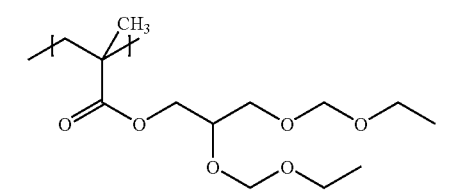
(A046) 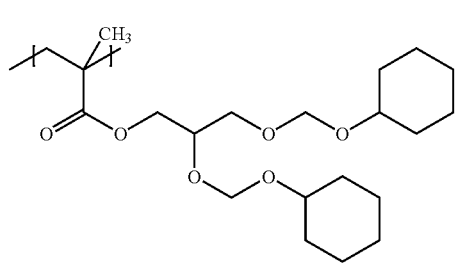
(A051) 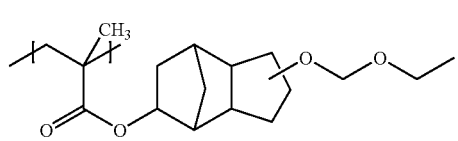
(A052) 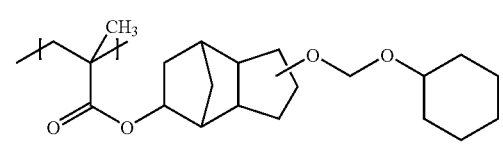
(A101) 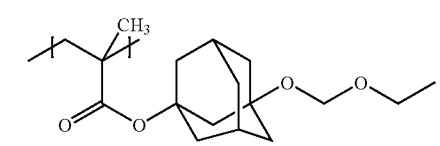
(A102) 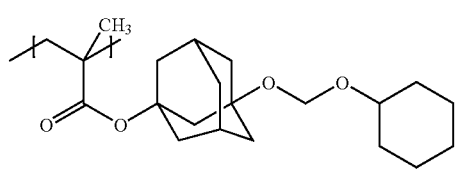
(A103) 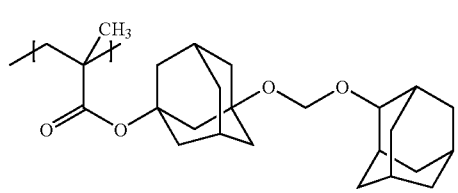
(A111) 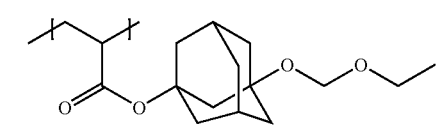
(A104) 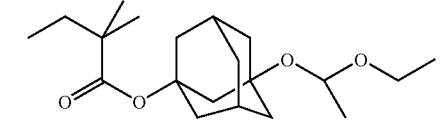
(A112) 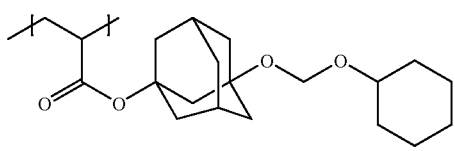
(A113) 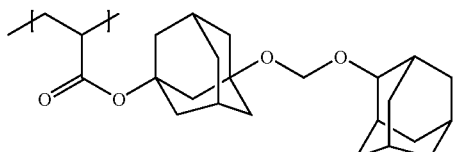
(A122) 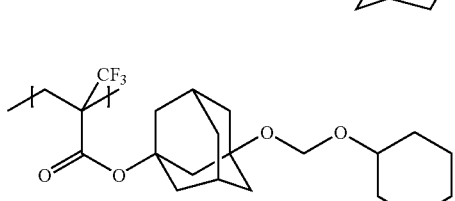
(A123) 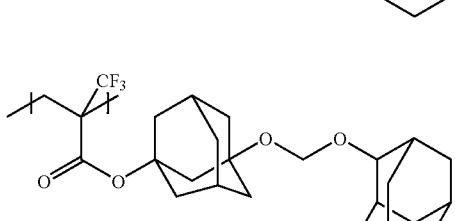
(A131) 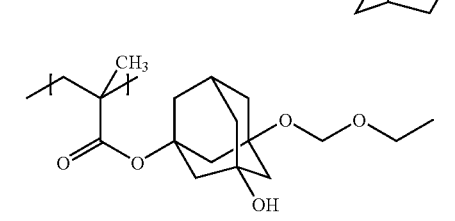
(A132) 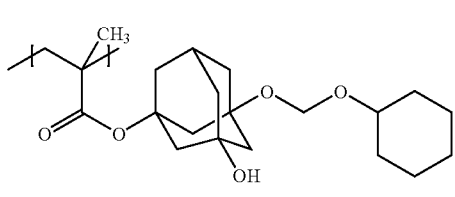
(A135) 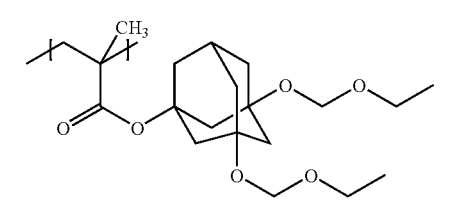
(A136) 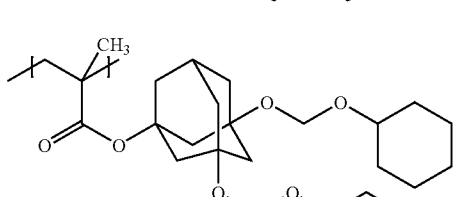

(A142)
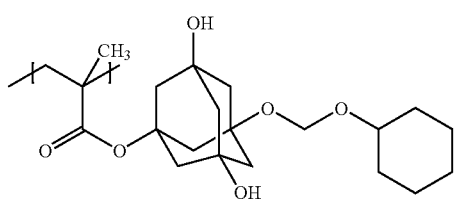

(A147)
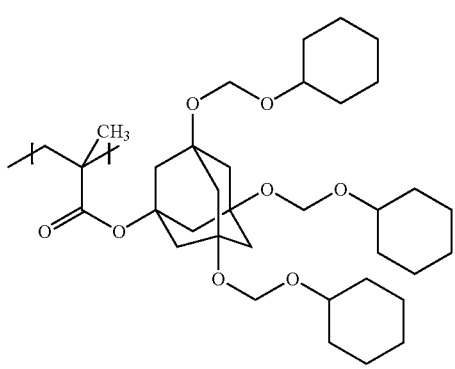

(A133)
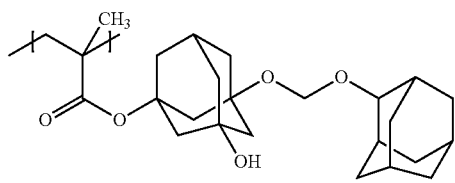

(A148)
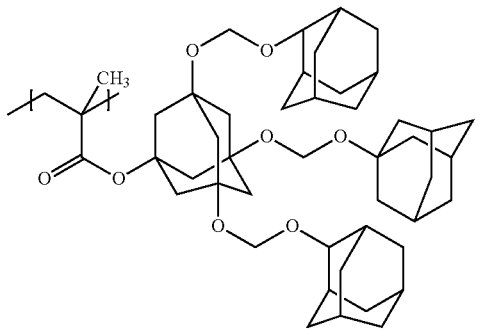

(4) Repeating Unit (D)

The repeating unit (D) is a repeating unit having a structure including an alkali-soluble group and a hydroxyl group other than that shown in the repeating unit (B). The repeating unit (D) controls, for example, the solubility of the copolymer in a solvent for lithography or an alkaline developer, and the diffusion length of an acid in a thin film. The repeating unit (D) preferably has a structure represented by any of the following formulas (D1) to (D3), more preferably a structure represented by formula (D1) or (D2), particularly preferably a structure represented by formula (D1)

(D1)
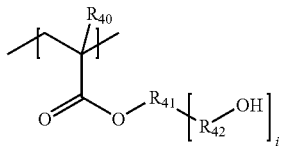

In formula (D1), $R_{40}$ represents a hydrogen atom or a C1-C4 hydrocarbon group which may be substituted by a fluorine atom; specifically, a hydrogen atom or a C1-C4 alkyl group such as methyl, ethyl, n-propyl, i-propyl, n-butyl, i-butyl, or trifluoromethyl. $R_{40}$ is preferably a hydrogen atom, a methyl group, or a trifluoromethyl group. $R_{41}$ represents a C2-C12 hydrocarbon group which may include a fluorine atom, an oxygen atom, or a sulfur atom; specifically, a linear or branched saturated hydrocarbon group such as an ethylene group or an isopropylene group, or a saturated alicyclic hydrocarbon group having, for example, a cyclohexane ring, a norbornane ring, a 7-oxa-norbornane ring, a 7-thia-norbornane ring, an adamantane ring, or a tetracyclo[4.4.0.1$^{2,5}$.1$^{7,10}$]dodecane ring. $R_{41}$ is preferably a saturated alicyclic hydrocarbon group having a cyclohexane ring, a norbornane ring, or an adamantane ring. $R_{42}$ represents a single bond or a C1-C4 di- to tetra-valent hydrocarbon group which may be substituted by a fluorine atom; specifically, a single bond, or a linear or branched alkylene group which may be substituted by a fluorine atom, such as methylene, 1,1-ethylene, 2,2-propylene, 1,1,1,3,3,3-hexafluoro-2,2-propylene, or 1,1,1-trifluoro-2-trifluoromethyl-2,3-propylene. $R_{42}$ is preferably a single bond, a 1,1,1,3,3,3-hexafluoro-2,2-propylene group, or a 1,1,1-trifluoro-2-trifluoromethyl-2,3-propylene group. Particularly preferably, $R_{41}$ is an adamantyl group and $R_{42}$ is a single bond. In formula (D1), i is an integer from 1 to 3.

(D2)
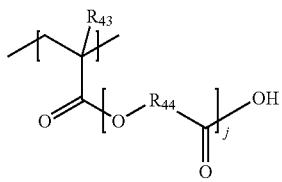

In formula (D2), $R_{43}$ represents a hydrogen atom or a C1-C4 hydrocarbon group which may be substituted by a fluorine atom; specifically, a hydrogen atom or a C1-C4 alkyl group such as methyl, ethyl, n-propyl, i-propyl, n-butyl, i-butyl, or trifluoromethyl. $R_{43}$ is preferably a hydrogen atom, a methyl group, or a trifluoromethyl group. $R_{44}$ represents a C6-C12 alicyclic hydrocarbon group which may include an oxygen atom or a sulfur atom, and is preferably a saturated alicyclic hydrocarbon group which may include an oxygen atom or a sulfur atom; specifically, a hydrocarbon group having, for example, a norbornane ring, a 7-oxa-norbornane ring, a 7-thia-norbornane ring, or a tetracyclo[4.4.0.1$^{2,5}$.1$^{7,10}$]dodecane ring. $R_{44}$ is preferably a hydrocarbon group having a norbornane ring or a tetracyclo[4.4.0.1$^{2,5}$.1$^{7,10}$]dodecane ring. In formula (D2), j is an integer of 0 or 1.

(D3)

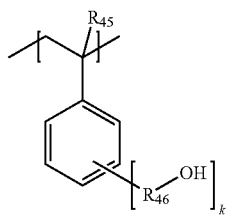

In formula (D3), $R_{45}$ represents a hydrogen atom or a C1-C4 hydrocarbon group which may be substituted by a fluorine atom; specifically, a hydrogen atom or a C1-C4 alkyl group such as methyl, ethyl, n-propyl, i-propyl, n-butyl, i-butyl, or trifluoromethyl. Preferred is a hydrogen atom, a methyl group, or a trifluoromethyl group. $R_{46}$ represents a single bond or a C1-C4 di- or tri-valent hydrocarbon group which may be substituted by a fluorine atom; specifically, a single bond, or a linear or branched alkylene group such as methylene, 1,1-ethylene, 2,2-propylene, 1,1,1,3,3,3-hexafluoro-2,2-propylene, or 1,1,1-trifluoro-2-trifluoromethyl-2,3-propylene. $R_{46}$ is preferably a single bond, a 1,1,1,3,3,3-hexafluoro-2,2-propylene group, or a 1,1,1-trifluoro-2-trifluoromethyl-2,3-propylene group, particularly preferably a single bond. In formula (D3), k is an integer of 1 or 2.

Specific examples of the repeating unit (D) will be described below. However, the present invention is not limited to these examples. The present invention may employ a single type of the repeating unit (D) or a plurality of types of the repeating unit (D) having different structures.

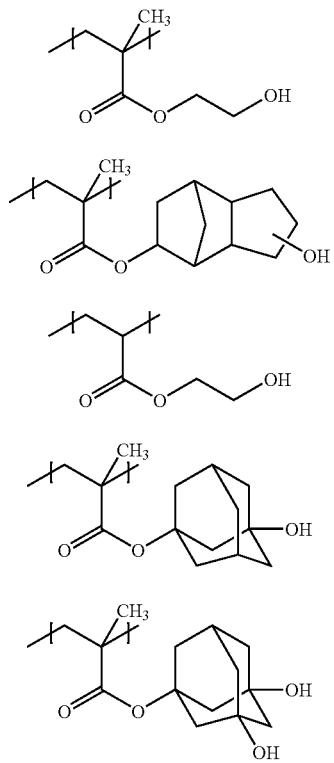

(D101)

(D102)

(D103)

(D104)

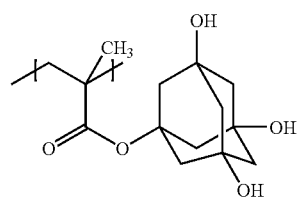

(D105)

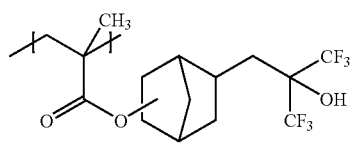

(D106)

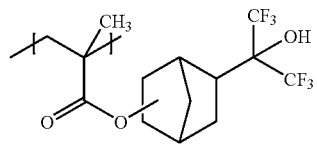

(D107)

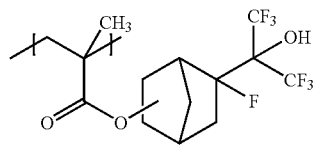

(D108)

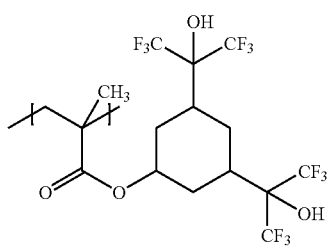

(D109)

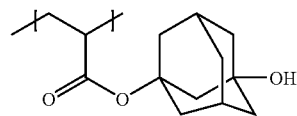

(D113)

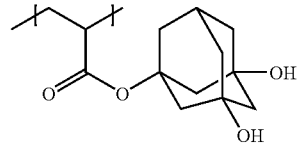

(D114)

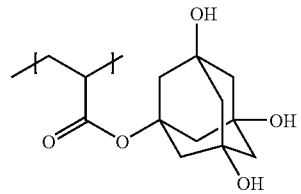

(D115)

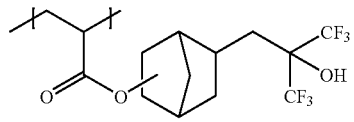

(D116)

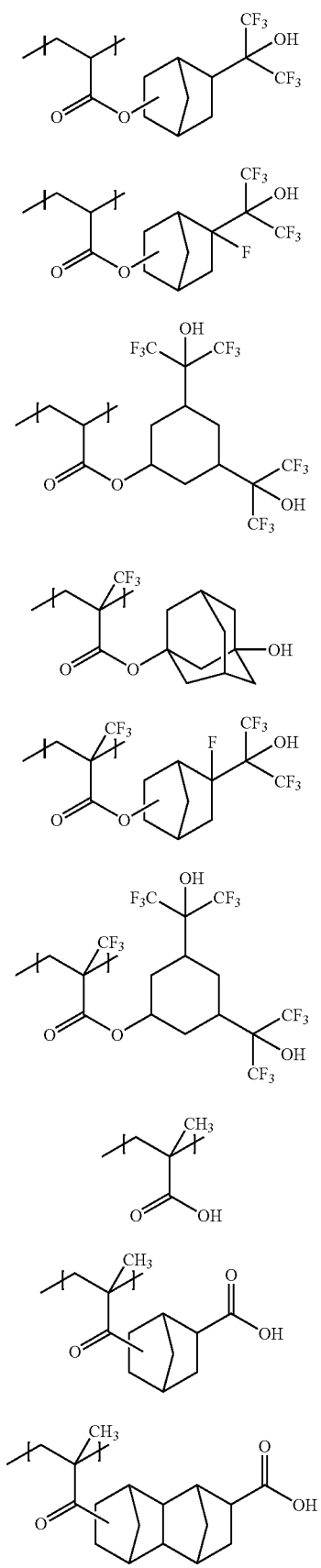
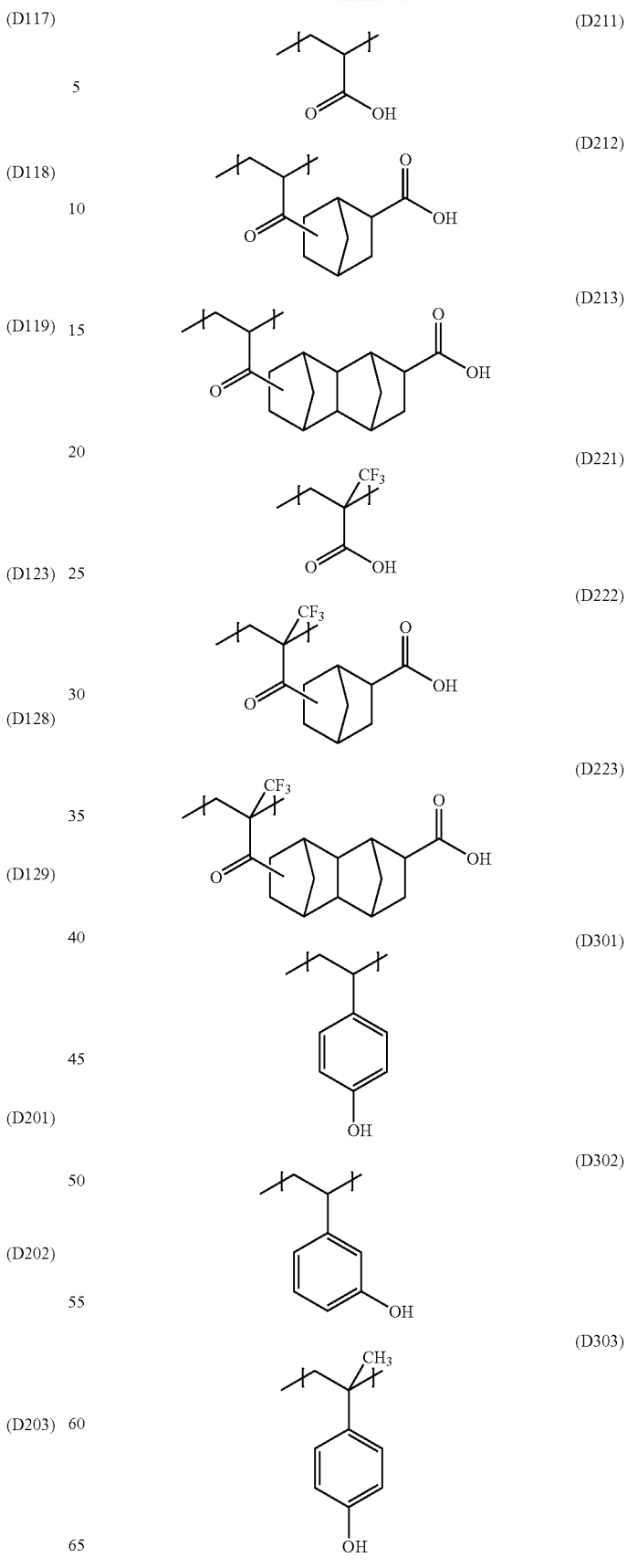

-continued

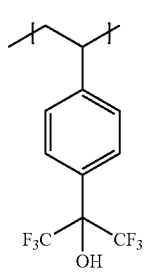
(D303)

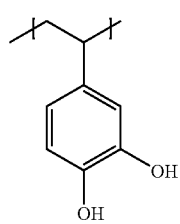
(D304)

(5) Repeating Unit (E)

The repeating unit (E) is a repeating unit which does not include a hydroxyl group, lactone, or an alkali-soluble group, and in which neither alcoholic hydroxyl group nor alkali-soluble group is generated through the action of an acid. The repeating unit (E) controls, for example, the solubility of the copolymer in a solvent for lithography or an alkaline developer, and the diffusion length of an acid in a thin film. The repeating unit (E) preferably has a structure represented by the following formula (E1).

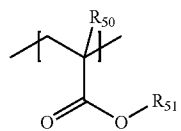
(E1)

In formula (E1), $R_{50}$ represents a hydrogen atom or a C1-C4 hydrocarbon group which may be substituted by a fluorine atom; specifically, a hydrogen atom or a C1-C4 alkyl group such as methyl, ethyl, n-propyl, i-propyl, n-butyl, i-butyl, or trifluoromethyl. $R_{50}$ is preferably a hydrogen atom, a methyl group, or a trifluoromethyl group. $R_{51}$ represents a C1-C12 saturated hydrocarbon group in which the carbon forming the ester bond is primary to tertiary carbon, or a 1-adamantyl group. Specific examples include a methyl group, an ethyl group, an n-propyl group, an i-propyl group, an n-butyl group, an i-butyl group, a cyclopentyl group, a cyclohexyl group, a 2-norbornyl group, a 2-isobornyl group, an 8-tricyclo[5.2.1.0$^{2,6}$]decanyl group, a 1-adamantyl group, a 2-adamantyl group, and a 4-tetracyclo[4.4.0.1$^{2,5}$.1$^{7,10}$] dodecanyl group.

Specific examples of the repeating unit (E) will be described below. However, the present invention is not limited to these examples. The present invention may employ a single type of the repeating unit (E) or a plurality of types of the repeating unit (E) having different structures.

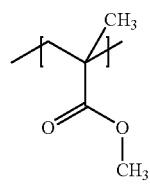
(E101)

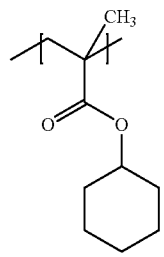
(E102)

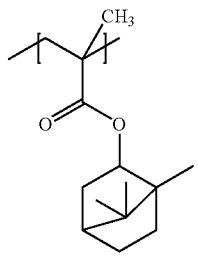
(E103)

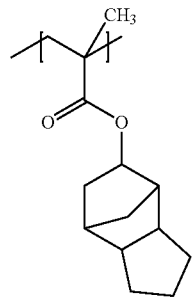
(E104)

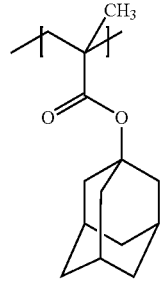
(E105)

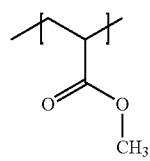
(E111)

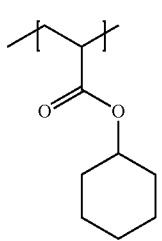

(E112)

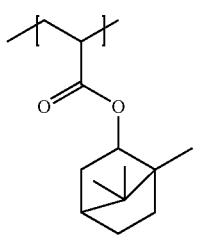

(E113)

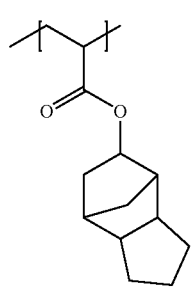

(E114)

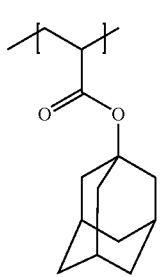

(E115)

(6) Composition of Repeating Units

No particular limitation is imposed on the composition of the respective repeating units, so long as the fundamental performance of the copolymer for semiconductor lithography is not impaired. For example, the repeating unit (A) is generally employed in an amount falling within a range of 1 to 50 mol %, preferably 5 to 40 mol %, more preferably 10 to 30 mol %. The repeating unit (B) is generally employed in an amount falling within a range of 10 to 80 mol %, preferably 15 to 70 mol %, more preferably 20 to 60 mol %. The repeating unit (C) is generally employed in an amount falling within a range of 0 to 80 mol %, preferably 10 to 70 mol %, more preferably 20 to 60 mol %. The repeating unit (D) is generally employed in an amount falling within a range of 0 to 30 mol %, preferably 0 to 20 mol %, more preferably 0 to 10 mol %. The repeating unit (E) is generally employed in an amount falling within a range of 0 to 30 mol %, preferably 0 to 20 mol %, more preferably 0 to 10 mol %.

(7) End Structure

The copolymer of the present invention has an already known end structure. Generally, the copolymer has, at a polymerization initiation end thereof, a radical structure generated from a radical polymerization initiator. When a chain transfer agent is employed, the copolymer has, at a polymerization initiation end thereof, a radical structure generated from the chain transfer agent. When chain transfer occurs in, for example, a solvent or a monomer, the copolymer has, at a polymerization initiation end thereof, a radical structure generated from the solvent or monomer. When recombination is stopped through termination reaction, the copolymer may have, at both ends thereof, polymerization initiation ends, whereas when disproportionation termination occurs, the copolymer may have, at one end thereof, a polymerization initiation end, and, at the other end, an end structure derived from a monomer employed. When a polymerization terminator is employed, the copolymer may have, at one end thereof, a polymerization initiation end, and, at the other end, an end structure derived from the polymerization terminator. A plurality of these initiation and termination reactions may occur in a single polymerization reaction system. In such a case, the copolymer is in the form of a copolymer mixture having a plurality of end structures. The polymerization initiator, chain transfer agent, and solvent which may be employed in the present invention will be described hereinbelow.

(8) Molecular Weight and Polydispersibility Index

When the copolymer has an excessively high weight average molecular weight (Mw), the copolymer exhibits poor solubility in a resist solvent or an alkaline developer, whereas when the copolymer has an excessively low Mw, the coating performance of the copolymer serving as a resist is impaired. Therefore, the weight average molecular weight (Mw) preferably falls within a range of 1,000 to 40,000, more preferably 1,500 to 30,000, particularly preferably 2,000 to 20,000. The molecular weight distribution (Mw/Mn) preferably falls within a range of 1.0 to 5.0, more preferably 1.0 to 3.0, particularly preferably 1.2 to 2.5.

2. Surface Characteristics of Thin Film Formed from the Copolymer

The copolymer of the present invention has, at least, the repeating unit (A) and the repeating unit (B). In the case where a solution of the copolymer in propylene glycol monomethyl ether acetate (hereinafter may be abbreviated as "PGMEA") is applied to a wafer and then heated to form a thin film, when a droplet of pure water (15 μL) is added onto the thin film, and the wafer is gradually inclined, the inclination of the wafer at the time when the water droplet starts to move (hereinafter, the inclination may be referred to as a "falling angle") is 35° or less, or the contact angle of the top edge of the water droplet at the time when the water droplet starts to move (hereinafter, the angle may be referred to as a "sweepback angle") is 64° or more.

No particular limitation is imposed on the copolymer concentration of the PGMEA solution, so long as the copolymer is dissolved in PGMEA, and a uniform film can be formed when the solution is applied onto a wafer. However, the copolymer concentration is generally 5 to 30 mass %, preferably 7 to 20%, particularly preferably 10 to 15%. The wafer employed is preferably a silicon wafer (i.e., the most common wafer). Spin coating is preferred as means for application of the copolymer solution. Generally, the copolymer concentration of the solution, the rotation speed during spin coating, etc. are adjusted so that a finally formed film has a thickness of 100 to 2,000 nm (preferably 200 to 1,000 nm, particularly preferably 400 to 600 nm). The wafer onto which the copolymer solution has been applied is heated by means of, for example, a hot plate at 80 to 150° C. (preferably 100 to 120° C., particularly preferably 105° C.) for 30 to 120 seconds (preferably 45 to 90 seconds, particularly preferably 60 seconds), to thereby form a thin film.

A droplet of pure water (15 μL) is added onto the thus-formed thin film at room temperature, and the wafer is inclined at a rate of 1 to 3°/sec, particularly preferably 1.5 to 2.0°/sec. At the time when the water droplet starts to move, the inclination of the wafer (falling angle) and the contact angle of the top edge of the water droplet (sweepback angle) are measured. Measurement is carried out at three or more points (preferably five or more points) on a virgin thin film surface with which water has never come into contact, and the thus-obtained measurements are averaged. Measurement is preferably carried out by means of an apparatus of DropMaster series manufactured by Kyowa Interface Science Co., Ltd., particularly preferably DropMaster 500.

3. Production Steps of the Copolymer

The copolymer of the present invention can be produced through at least a step (P) of radical-polymerizing monomers in a heated organic solvent. If necessary, the step (P) may be carried out in combination with, for example, a step (R) of removing, from the copolymer, unwanted substances such as unreacted substances (e.g., monomers or a polymerization initiator) or low-molecular-weight components (e.g., oligomers); a step (S) of removing low-boiling-point impurities or replacing the original solvent with a solvent suitable for the subsequent step or lithography; a step (T) of reducing the amount of metal impurities which are undesirable for formation of a semiconductor; or a step (U) of reducing the amount of substances (e.g., microgel) which may cause pattern defects.

(1) Step (P)

In the step (P), monomers are radical-polymerized in an organic solvent in the presence of a radical polymerization initiator. The step (P) may be a known process; for example, a step (P1) in which monomers are dissolved in a solvent together with a polymerization initiator, and the solution is heated as is for polymerization of the monomer (hereinafter the step may be referred to as the "batch-type temperature elevation step (P1)"); a step (P2) in which monomers and a polymerization initiator are dissolved together in a solvent as needed, and the resultant solution is added dropwise to a heated solvent for polymerization of the monomers (hereinafter the step may be referred to as the "mixing-dropwise addition step (P2)"); a step (P3) in which monomers and a polymerization initiator are separately dissolved in different solvents as needed, and the resultant solutions are separately added dropwise to a heated solvent for polymerization of the monomers (hereinafter the step may be referred as the "separate dropwise addition step (P3)"); or a step (P4) in which monomers are dissolved in a solvent and heated, and a polymerization initiator dissolved in a solvent is added dropwise to the monomer solution for polymerization of the monomers (hereinafter the step may be referred to as the "initiator dropwise addition step (P4)").

In the case of the batch-type temperature elevation step (P1), the mixing-dropwise addition step (P2), or the initiator dropwise addition step (P4), high-concentration unreacted monomers are likely to come into contact with low-concentration radicals (in a polymerization system (for the step (P1) or (P4)), or in a reservoir for the monomer solution which is to be added dropwise to a polymerization system (for the step (P2)), and thus a polymer having a molecular weight of 100,000 or more (i.e., high polymer), which is one of the causes for pattern defects, tends to be generated. In contrast, in the case of the separate dropwise addition step (P3), the monomer solution is not co-present with a polymerization initiator in a reservoir for the monomer solution, and unreacted monomers are maintained at low concentration upon dropwise addition of the monomer solution into a polymerization system, resulting in generation of no high polymer. Therefore, the separate dropwise addition step (P3) is particularly preferred as a process for producing the copolymer of the present invention. In the mixing-dropwise addition step (P2) or the separate dropwise addition step (P3), monomers may be partially added to a heated solvent in advance. For example, the composition of monomers added, or the compositional proportions of monomers, a polymerization initiator, and a chain transfer agent which are added may be varied with dropwise addition time by dropwise addition of a plurality of solutions of different monomer compositions, polymerization initiator concentrations, and chain transfer agent concentrations.

The polymerization initiator employed may be a known radical polymerization initiator and is preferably a radical polymerization initiator such as an azo compound or a peroxide. Specific examples of the azo compound include 2,2'-azobisisobutyronitrile, 2,2'-azobis(2-methylbutyronitrile), dimethyl 2,2'-azobisisobutyrate, 1,1'-azobis(cyclohexane-1-carbonitrile), and 4,4'-azobis(4-cyanovaleric acid). Specific examples of the peroxide include decanoyl peroxide, lauroyl peroxide, benzoyl peroxide, bis(3,5,5-trimethylhexanoyl) peroxide, succinic acid peroxide, tert-butyl peroxy-2-ethylhexanoate, tert-butyl peroxypivalate, and 1,1,3,3-tetramethylbutyl peroxy-2-ethylhexanoate. These polymerization initiators may be employed singly or in combination. The amount of a polymerization initiator employed may be determined in consideration of target Mw, the types and compositional proportions of monomers (i.e., raw materials), the polymerization initiator, a chain transfer agent, and a solvent, and production conditions (e.g., polymerization temperature and dropwise addition rate).

Any known chain transfer agent may optionally be employed. Particularly, a thiol compound is preferably employed, and the thiol compound employed may be selected from among a variety of known thiol compounds. Specific examples include t-dodecyl mercaptan, mercaptoethanol, mercaptoacetic acid, and mercaptopropionic acid. A thiol compound having a structure in which a 2-hydroxy-1,1,1,3,3,3-hexafluoro-2-propylidene group is bonded to a saturated hydrocarbon is particularly preferably employed, since the compound exhibits the effect of preventing roughness or defects in lithography patterns.

The amount of a chain transfer agent employed may be determined in consideration of target Mw, the types and compositional proportions of monomers (i.e., raw materials), a polymerization initiator, the chain transfer agent, and a solvent, and production conditions (e.g., polymerization temperature and dropwise addition rate). In the batch-type temperature elevation step (P1), a chain transfer agent employed may be dissolved in a solvent together with monomers and a polymerization initiator, and the resultant solution may be heated. In the mixing-dropwise addition step (P2), the separate dropwise addition step (P3), or the initiator dropwise addition step (P4), a chain transfer agent employed may be mixed with monomers or a polymerization initiator, followed by dropwise addition, or may be dissolved in a heated solvent in advance.

No particular limitation is imposed on the polymerization solvent employed, so long as it can dissolve monomers, a polymerization initiator, a chain transfer agent, and a copolymer produced through polymerization. Specific examples of the solvent include ketones such as acetone, methyl ethyl ketone, methyl isoamyl ketone, methyl amyl ketone, and cyclohexanone; alcohols such as methanol, ethanol, and isopropanol; ether alcohols such as ethylene glycol monomethyl ether, ethylene glycol monoethyl ether, ethylene glycol monobutyl ether, propylene glycol monomethyl ether, and 3-methoxy-3-methyl-1-butanol; ether esters which are compounds obtained through esterification between the aforementioned ether alcohols and acids (e.g., acetic acid); esters such as methyl acetate, ethyl acetate, butyl acetate, methyl propionate, methyl 3-methoxypropionate, ethyl 3-ethoxypropionate, methyl lactate, ethyl lactate, and γ-butyrolactone; ethers such as tetrahydrofuran, 1,4-dioxane, ethylene glycol dimethyl ether, and diethylene glycol dimethyl ether; aromatic hydrocarbons such as toluene and xylene; amides such as N,N-dimethylformamide and N-methylpyrrolidone; dimethyl sulfoxide; and acetonitrile. These solvents may be employed singly or in combination of two or more species.

The polymerization temperature in the step (P) may be appropriately determined in consideration of, for example, the boiling points of a solvent, monomers, a chain transfer agent, etc. and the half-life temperature of a polymerization initiator. When the polymerization temperature is low, polymerization is less likely to proceed, which causes problems in terms of productivity, whereas when the polymerization temperature is higher than necessary, problems arise in terms of stability of monomers and a copolymer.

Therefore, the polymerization temperature is preferably determined to fall within a range of 40 to 120° C., particularly preferably 60 to 100° C.

In the mixing-dropwise addition step (P2) or the separate dropwise addition step (P3), when the dropwise addition time is short, molecular weight distribution is likely to broaden, and the temperature of a polymerization mixture is lowered due to dropwise addition of a large amount of a solution at one time, which is not preferred. In contrast, when the dropwise addition time is long, the copolymer undergoes thermal history more than necessary, and productivity is reduced, which is not preferred. Therefore, the dropwise addition time is generally 0.5 to 24 hours, preferably 1 to 12 hours, particularly preferably 2 to 8 hours.

Preferably, aging is carried out after completion of dropwise addition (in the case of the mixing-dropwise addition step (P2) or the separate dropwise addition step (P3)) or after temperature elevation to the polymerization temperature (in the case of the batch-type temperature elevation step (P1) or the initiator dropwise addition step (P4)) by, for example, maintaining the polymerization mixture at the polymerization temperature at a predetermined period of time, or further elevating the temperature of the polymerization mixture to a higher level, so as to allow the remaining unreacted monomers to react. When the aging time is excessively long, productivity per unit time is reduced, and the copolymer undergoes thermal history more than necessary, which is not preferred. Therefore, the aging time is generally 12 hours or shorter, preferably 6 hours or shorter, particularly preferably 1 to 4 hours.

(2) Step (R)

In the step (R), extraction with a solvent is carried out for removal of unreacted substances (e.g., monomers or a polymerization initiator) or low-molecular-weight components (e.g., oligomers) contained in the copolymer produced through the step (P). The step (R) may be, for example, (R1): a process in which the copolymer is precipitated through addition of a poor solvent, and then separation of the solvent phase is performed; (R1a): a process in which, after completion of the step (R1), a poor solvent is added to wash the copolymer, and then separation of the solvent phase is performed; (R1b): a process in which, after completion of the step (R1), a good solvent is added to redissolve the copolymer, and a poor solvent is added to reprecipitate the copolymer, followed by separation of the solvent phase; (R2): a process in which a poor solvent is added to form two solvent phases (i.e., poor solvent phase and good solvent phase), and separation of the poor solvent phase is performed; or (R2a): a process in which, after completion of the step (R2), a poor solvent is added to wash the good solvent phase, and then separation of the poor solvent phase is performed. The step (R1a), (R1b), or (R2a) may be repeatedly carried out, or these steps may be carried out in combination.

No particular limitation is imposed on the poor solvent employed, so long as the copolymer is less likely to dissolve therein. Examples of the poor solvent include water, alcohols such as methanol and isopropanol, and saturated hydrocarbons such as hexane and heptane. No particular limitation is imposed on the good solvent employed, so long as the copolymer is likely to dissolve therein. A single good solvent or a mixture of two or more good solvents may be employed. The good solvent is preferably the same as a polymerization solvent, from the viewpoint of control of the production process. Examples of the good solvent may be the same as those described above as polymerization solvents employed in the step (P).

(3) Step (S)

In the step (S), low-boiling-point impurities are removed from a copolymer solution, or the original solvent is replaced with a solvent suitable for the subsequent step or the composition for lithography. The step (S) may be, for example, a step (S1) in which a polymer solution is concentrated while heating under reduced pressure, and optionally, a solvent is added to the solution, followed by further concentration; or a step (S2) in which a polymer solution is optionally concentrated while heating under reduced pressure, subsequently, a solvent suitable for the subsequent step or the composition for lithography is supplied while the original solvent and the thus-supplied solvent are removed through evaporation, and optionally, further concentration is performed so as to replace the original solvent with the solvent suitable for the subsequent step or the composition for lithography.

The step (S) is carried out in the case where, for example, the solvent of the composition for lithography differs from the solvent of the polymer solution obtained through the steps (P) and (R), or undesirable impurities are contained in the composition for lithography. Preferably, the step (S) is carried out before the step (U) of preparing the composition for lithography.

The polymer solution may be temporarily formed into a solid through drying under reduced pressure without being subjected to the step (S), followed by dissolution of the solid in another solvent. However, this procedure is not preferred, since impurities or the solvent is likely to remain in the solid, or the copolymer undergoes thermal history more than necessary.

No particular limitation is imposed on the temperature of the step (S), so long as the copolymer is not degraded. Generally, the temperature is preferably 100° C. or lower, more preferably 80° C. or lower, much more preferably 70° C. or lower, particularly preferably 60° C. or lower. When the amount of a solvent newly supplied for solvent replacement is excessively small, low-boiling-point compounds cannot be sufficiently removed, whereas when the amount of the solvent is excessively large, a long period of time is required for solvent replacement, and the copolymer undergoes thermal history more than necessary, which is not preferred. The amount of the solvent is generally 1.05 to 10 times (preferably 1.1 to 5 times, particularly preferably 1.2 to 3 times) that of the solvent required for a finished solution.

(4) Step (T)

In the step (T), metal components undesirable for semiconductor lithography are reduced in amount. The step (T) is optionally carried out, since metal components may enter the polymer solution from raw materials, sub-materials, apparatuses, or the environment, and the amount of the metal components may exceed an acceptable level for semiconductor formation. When the poor solvent employed in the step (R) is a polar solvent, the amount of metal components may be reduced in the step (R). In such a case, the step (R) may also serve as the step (T). Alternatively, the step (T) may be, for example, a step (T1) in which the polymer solution is brought into contact with a cation exchange resin; a step (T2) in which the polymer solution is brought into contact with a cation exchange resin, and an anion exchange resin or a mixture of acid-adsorbing resins; or a step (T3) in which the polymer solution is caused to pass through a filter containing a substance having a positive zeta potential (e.g., polyamide-polyamine-epichlorohydrin cationic resin). These steps may be carried out in combination. Examples of the filter employed in the step (T3) include products of Cuno Inc., such as Zeta Plus 40QSH, Zeta Plus 020GN, and Electropor IIEF, which are trademarks (the same shall apply hereinafter).

(5) Step (U)

In the step (U), undesirable microgels of high polymer or the like, which may cause pattern defects, are reduced in amount by causing the copolymer dissolved in an organic solvent to pass through a filter. The filtration accuracy of the filter employed is 0.2 μm or less, preferably 0.1 μm or less, particularly preferably 0.05 μm or less. Examples of the material of the filter include polyolefins such as polyethylene and polypropylene; polar-group-containing resins such as polyamide, polyester, and polyacrylonitrile; and fluorine-containing resins such as polyethylene fluoride. Polyamide is particularly preferred.

Examples of the polyamide filter include Ultipleat P-Nylon 66 and Ultipor N66 (products of Pall Corporation) and PhotoSHIELD and Electropor IIEF (products of Cuno Inc.). Examples of the polyethylene filter include Microguard Plus HC10 and Optimizer D (products of Nihon Entegris K.K.). These filters may be employed singly or in combination of two or more species.

4. Composition for Lithography

The above-produced copolymer may be prepared into a chemical amplification-type resist composition through the following procedure: a dried solid of the copolymer is dissolved in one or more solvents for lithography, or a solution of the copolymer in a solvent for lithography is optionally diluted with the same or a different solvent for lithography; and the thus-prepared solution or diluted solution is mixed with a radiation-sensitive acid-generator (X) {hereinafter may be referred to as a "component (X)"}, an acid diffusion preventing agent (Y) (e.g., a nitrogen-containing organic compound) for preventing diffusion of an acid to a portion which is not exposed to radiation {hereinafter may be referred to as a "component (Y)"}, and optionally an additional additive (Z) {hereinafter may be referred to as a "component (Z)"}.

No particular limitation is imposed on the solvent for lithography, so long as it can dissolve components of the composition for lithography to give a uniform solution. The solvent for lithography employed may be any one of hitherto known solvents for chemical amplification-type resists, or a mixture of two or more species of the solvents. Generally, the solvent for lithography may be selected from among the above-exemplified polymerization solvents in the step (P) and the above-exemplified good solvents in the step (R), in consideration of, for example, solubility of components other than the copolymer, viscosity, boiling point, and absorption of radiation employed for lithography. Particularly preferred solvents for lithography are methyl amyl ketone, cyclohexanone, ethyl lactate (EL), γ-butyrolactone, and propylene glycol monomethyl ether acetate (PGMEA). Of these, a mixture of PGMEA and another polar solvent is particularly preferred. The polar solvent is particularly preferably EL.

No particular limitation is imposed on the amount of the solvent for lithography contained in the composition for lithography. However, generally, the amount of the solvent is appropriately determined so that the copolymer concentration of the composition is such a level that it can be applied to, for example, a substrate, and so that the composition has an appropriate viscosity corresponding to application thickness. The amount of the solvent employed is determined so that the solid content of the composition for lithography is generally 2 to 20 mass %, preferably 5 to 15 mass %.

The component (X) employed may be appropriately selected from among radiation-sensitive acid-generators which have hitherto been proposed for chemical amplification-type resists. Examples of such a radiation-sensitive acid-generator include onium salts such as iodonium salts and sulfonium salts; oxime sulfonates; diazomethanes such as bisalkyl or bisarylsulfonyldiazomethanes; nitrobenzyl sulfonates; iminosulfonates; and disulfones. Particularly preferred is an onium salt in which a fluorinated alkyl sulfonate ion serves as an anion. These agents may be employed singly or in combination of two or more species. The component (X) is generally incorporated in an amount of 0.5 to 30 parts by mass, preferably 1 to 10 parts by mass, on the basis of 100 parts by mass of the copolymer.

The component (Y) employed may be appropriately selected from among acid diffusion preventing agents which have hitherto been proposed for chemical amplification-type resists. Such an acid diffusion preventing agent may be a nitrogen-containing organic compound and is preferably a primary to tertiary alkylamine or a hydroxyalkylamine. Particularly preferred is a tertiary alkylamine or a tertiary hydroxyalkylamine; in particular, triethanolamine or triisopropanolamine. These agents may be employed singly or in combination of two or more species. The component (Y) is generally incorporated in an amount of 0.01 to 5.0 parts by mass on the basis of 100 parts by weight of the copolymer.

If necessary, the additional additive {component (Z)} may be appropriately added. Examples of the additive include compounds which have conventionally been used as additives for lithography, such as organic carboxylic acids and phosphorus oxo acids for preventing reduction in sensitivity of an acid-generator or for improving, for example, the form of lithography patterns or post-exposure stability, additional resins for improving the performance of a resist film, surfactants for improving applicability of the composition, dissolution-inhibiting agents, plasticizers, stabilizers, coloring agents, antihalation agents, and dyes. Examples of the organic carboxylic acid include malonic acid, citric acid, malic acid, succinic acid, benzoic acid, and salicylic acid. These acids may be employed singly or in combination of two or more species. Such an organic carboxylic acid is incorporated in an amount of 0.01 to 5.0 parts by mass on the basis of 100 parts by mass of the copolymer.

EXAMPLES

The present invention will next be described in more detail by way of examples, which should not be construed as limiting the invention thereto. Abbreviations used in the below-described examples have the following meanings.

Monomer
  Monomer G: γ-Butyrolacton-2-yl methacrylate
  Monomer Na: 5-Acryloyloxy-2,6-norbornanecarbolactone
  Monomer M: 2-Methyl-2-adamantyl methacrylate
  Monomer E: 2-Ethyl-2-adamantyl methacrylate
  Monomer O: 3-Hydroxy-1-adamantyl methacrylate
  Monomer Oem: 3-(Ethoxymethoxy)-1-adamantyl methacrylate
  Monomer Ohm: 3-(Cyclohexyloxymethoxy)-1-adamantyl methacrylate
  Monomer Oam: 3-(2-Adamantoxymethoxy)-1-adamantyl methacrylate
  Monomer Oee: 3-(1-Ethoxyethoxy)-1-adamantyl methacrylate Repeating Unit
  G: Repeating unit derived from monomer G . . . the aforementioned (C101)
  Na: Repeating unit derived from monomer Na . . . the aforementioned (C171)
  M: Repeating unit derived from monomer M . . . the aforementioned (B107)
  E: Repeating unit derived from monomer E . . . the aforementioned (B108)
  O: Repeating unit derived from monomer O . . . the aforementioned (D103)
  Oem: Repeating unit derived from monomer Oem . . . the aforementioned (A101)
  Ohm: Repeating unit derived from monomer Ohm . . . the aforementioned (A102)
  Oam: Repeating unit derived from monomer Oam . . . the aforementioned (A103)

Oee: Repeating unit derived from monomer Oee . . . the aforementioned (A104)

Polymerization Initiator

MAIB: Dimethyl-2,2'-azobisisobutyrate

Solvent

MEK: Methyl ethyl ketone

THF: Tetrahydrofuran

PGMEA: Propylene glycol monomethyl ether acetate

EL: Ethyl lactate (1) Measurement of Mw and Mw/Mn of Copolymer (GPC)

The Mw and Mw/Mn of a copolymer were measured through GPC under the following analysis conditions.

Apparatus: GPC 8220 (product of Tosoh Corporation)

Detector: Differential refractive index (R1) detector

Column: KF-804L (×3) (product of Showa Denko K.K.)

Sample: A copolymer (about 0.02 g) was dissolved in tetrahydrofuran (about 1 mL). The amount of the sample applied to GPC was adjusted to 60 µL.

(2) Measurement of Repeating Unit Composition and End Composition of Copolymer ($^{13}$C-NMR)

Apparatus: AV 400 (product of Bruker)

Sample: Powder of a copolymer (about 1 g) and Cr(acac)$_2$ (0.1 g) were dissolved in MEK (0.5 g) and deuterated acetone (1.5 g).

Measurement: The sample was placed into a glass tube (inner diameter: 10 mm), and measurement was carried out at 40° C. (number of scans: 10,000).

(3) Measurement of Contact Angle, Falling Angle, and Sweepback Angle

The copolymer concentration of a PGMEA solution was adjusted to 13 mass %, and then the solution was applied onto a 4-inch silicon wafer through spin coating. Thereafter, pre-baking was carried out on a hot plate at 105° C. for 60 seconds, to thereby form a thin film having a thickness of 500 nm. The wafer was placed on a contact angle meter (Drop-Master 500, product of Kyowa Interface Science Co., Ltd.), and a droplet of pure water (15 µL) was added onto the wafer, followed by measurement of the contact angle of the water droplet. Subsequently, the wafer was inclined at a rate of 1.7°/sec, and at the time when the water droplet started to move, the inclination of the wafer (falling angle) and the contact angle of the top edge of the water droplet (sweepback angle) were measured. Measurement was carried out at five points on a virgin surface, and the thus-obtained measurements were averaged.

(4) Measurement of Eth and γ Value (4-1) Preparation of Composition for Lithography A composition for lithography was prepared according to the following formulation.

Copolymer: 100 parts by mass

Component (X): 4-Methylphenyldiphenylsulfonium nonafluorobutanesulfonate (3.0 parts by mass)

Component (Y): Triethanolamine (0.3 parts by mass)

Component (Z): Surflon S-381 (product of Seimi Chemical Co., Ltd.) (0.1 parts by mass)

Solvent: PGMEA (450 parts by mass) and EL (300 parts by mass)

(4-2) Dry Lithography

The composition for lithography was applied onto a 4-inch silicon wafer through spin coating, and then pre-baking (PAB) was carried out on a hot plate at 100° C. for 90 seconds, to thereby form a thin film having a thickness of 350 nm. By means of an ArF excimer laser exposure apparatus (VUVES-4500, product of Litho Tech Japan Co., Ltd.), the thin film was exposed to light with varied exposure dose (18 shots, 10 mm×10 mm). Subsequently, post-baking (PEB) was carried out at 120° C. for 90 seconds, and then the thin film was developed by means of a resist development analyzer (RDA-800, product of Litho Tech Japan Co., Ltd.) in 2.38 mass % aqueous tetramethylammonium hydroxide solution at 23° C. for 180 seconds, followed by measurement of change over time in thickness of the resist film during development at different exposure doses. The thus-obtained data were used to determine the minimum exposure dose (Eth (mJ/cm$^2$)) required for achieving a film thickness of zero through 60-second development.

(4-3) Simulated Immersion Lithography

In a manner similar to that of the aforementioned dry lithography, the composition for lithography was applied onto a 4-inch silicon wafer through spin coating, and then pre-baking (PAB) was carried out to thereby form a thin film having a thickness of 350 nm. The wafer was immersed in ultrapure water contained in a vat for 30 seconds, and then water droplets were removed from the wafer through rotation by a spinner. Subsequently, by means of an ArF excimer laser exposure apparatus (VUVES-4500, product of Litho Tech Japan Co., Ltd.), the thin film was exposed to light with varied exposure dose (18 shots, 10 mm×10 mm). The thus-exposed wafer was immersed in ultrapure water contained in a vat for 30 seconds, and then water droplets were removed from the wafer through rotation by a spinner. Thereafter, in a manner similar to that of the aforementioned dry lithography, post-baking (PEB) was carried out, and then the thin film was developed by means of a resist development analyzer (RDA-800, product of Litho Tech Japan Co., Ltd.), followed by measurement of change over time in thickness of the resist film during development at different exposure doses. The thus-obtained data were used to determine the minimum exposure dose (Eth (mJ/cm$^2$)) required for achieving a film thickness of zero through 60-second development.

Example 1

MEK (125 g) was placed in a container, and monomer Na (36.2 g), monomer E (45.3 g), monomer Oem (23.0 g), and initiator MAIB (2.5 g) were dissolved therein, to thereby prepare a uniform "dropwise addition solution." Separately, MEK (75 g) was added to a polymerization vessel equipped with a stirrer and a cooler, and the vessel was filled with a nitrogen atmosphere. MEK contained in the polymerization vessel was heated to 79° C., and then the dropwise addition solution was added dropwise into the vessel at a constant rate by means of a constant rate pump over four hours while the temperature was maintained at 79 to 81° C., to thereby polymerize the monomers. After completion of dropwise addition, aging was further carried out at 80 to 81° C. for two hours, followed by cooling to room temperature.

Methanol (1,200 g) containing 5% water was added to a purification vessel equipped with a stirrer, cooled to 15° C. under stirring, and maintained at the temperature. The polymerization mixture was added dropwise into the purification vessel to thereby precipitate the copolymer, and then stirring was further performed for 30 minutes. Thereafter, a wet cake was obtained through filtration of the mixture. The wet cake was returned to the vessel, and methanol (1,200 g) was added thereto. The wet cake was washed under stirring for 30 minutes, followed by filtration. This washing of the wet cake was carried out again.

A portion (several g) was removed from the thus-obtained wet cake and dried under reduced pressure at 60° C. or lower for one hour, to thereby yield dry powder. By use of the dry powder, the compositional proportions of the repeating units of the copolymer, and the Mw and Mw/Mn of the copolymer were determined through the aforementioned methods. The remaining portion of the wet cake was dissolved in MEK and heated at 50° C. or lower while stirring under reduced pressure. While PGMEA was supplied to the solution, light components (e.g., MEK) and a portion of the supplied PGMEA were removed through evaporation, to thereby yield a PGMEA solution containing the copolymer in an amount of 25 mass %. A thin film was formed from the copolymer, and contact angle, falling angle, and sweepback angle were measured through the aforementioned methods. A composition for lithography was prepared through the aforementioned method, and Eth was determined. Table 1 summarizes data on Mw, Mw/Mn, the compositional proportions of repeating units, contact angle, falling angle, sweepback angle, and Eth.

Example 2

The procedure of Example 1 was repeated, except that monomer Oem was replaced with monomer Ohm (27.3 g), to thereby yield a copolymer and a composition for lithography. Table 1 summarizes data on the Mw and Mw/Mn of the copolymer, the compositional proportions of repeating units, contact angle, falling angle, sweepback angle, and Eth.

Example 3

The procedure of Example 1 was repeated, except that monomer Oem was replaced with monomer Oam (31.4 g), to thereby yield a copolymer and a composition for lithography. Table 1 summarizes data on the Mw and Mw/Mn of the copolymer, the compositional proportions of repeating units, contact angle, falling angle, sweepback angle, and Eth.

Example 4

The procedure of Example 1 was repeated, except that monomer Na was replaced with monomer G (27.6 g), and monomer E was replaced with monomer M (40.9 g), to thereby yield a copolymer and a composition for lithography. Table 1 summarizes data on the Mw and Mw/Mn of the copolymer, the compositional proportions of repeating units, contact angle, falling angle, sweepback angle, and Eth.

Example 5

The procedure of Example 2 was repeated, except that monomer Na was replaced with monomer G (27.6 g), and monomer E was replaced with monomer M (40.9 g), to thereby yield a copolymer and a composition for lithography. Table 1 summarizes data on the Mw and Mw/Mn of the copolymer, the compositional proportions of repeating units, contact angle, falling angle, sweepback angle, and Eth.

Example 6

The procedure of Example 3 was repeated, except that monomer Na was replaced with monomer G (27.6 g), and monomer E was replaced with monomer M (40.9 g), to thereby yield a copolymer and a composition for lithography. Table 1 summarizes data on the Mw and Mw/Mn of the copolymer, the compositional proportions of repeating units, contact angle, falling angle, sweepback angle, and Eth.

Comparative Example 1

The procedure of Example 1 was repeated, except that monomer Oem was replaced with monomer Oee (24.1 g), to thereby yield a copolymer and a composition for lithography. Table 1 summarizes data on the Mw and Mw/Mn of the copolymer, the compositional proportions of repeating units, contact angle, falling angle, sweepback angle, and Eth.

Comparative Example 2

The procedure of Example 1 was repeated, except that monomer Oem was not employed, to thereby yield a copolymer and a composition for lithography. Table 1 summarizes data on the Mw and Mw/Mn of the copolymer, the compositional proportions of repeating units, contact angle, falling angle, sweepback angle, and Eth.

Comparative Example 3

The procedure of Example 1 was repeated, except that monomer Oem was replaced with monomer O (18.5 g), to thereby yield a copolymer and a composition for lithography. Table 1 summarizes data on the Mw and Mw/Mn of the copolymer, the compositional proportions of repeating units, contact angle, falling angle, sweepback angle, and Eth.

Comparative Example 4

The procedure of Example 4 was repeated, except that monomer Oem was not employed, to thereby yield a copolymer and a composition for lithography. Table 1 summarizes data on the Mw and Mw/Mn of the copolymer, the compositional proportions of repeating units, contact angle, falling angle, sweepback angle, and Eth.

Comparative Example 5

The procedure of Example 4 was repeated, except that the amount of monomer M was changed to 51.1 g, and monomer Oem was replaced with monomer 0 (9.3 g), to thereby yield a copolymer and a composition for lithography. Table 1 summarizes data on the Mw and Mw/Mn of the copolymer, the compositional proportions of repeating units, contact angle, falling angle, sweepback angle, and Eth.

Comparative Example 6

The procedure of Example 4 was repeated, except that monomer Oem was replaced with monomer O (18.7 g), to thereby yield a copolymer and a composition for lithography. Table 1 summarizes data on the Mw and Mw/Mn of the copolymer, the compositional proportions of repeating units, contact angle, falling angle, sweepback angle, and Eth.

Comparative Example 7

The procedure of Example 4 was repeated, except that the amount of initiator MAIB was changed to 5.0 g, to thereby yield a copolymer and a composition for lithography. Table 1 summarizes data on the Mw and Mw/Mn of the copolymer, the compositional proportions of repeating units, contact angle, falling angle, sweepback angle, and Eth.

Comparative Example 8

The procedure of Example 4 was repeated, except that monomer M was replaced with monomer E (45.3 g), to thereby yield a copolymer and a composition for lithography. Table 1 summarizes data on the Mw and Mw/Mn of the copolymer, the compositional proportions of repeating units, contact angle, falling angle, sweepback angle, and Eth.

TABLE 1

|  | GPC | | Compositional proportions (mol %) | | | | | | | | Contact angle (°) | Falling angle (°) | Sweep-back angle (°) | Eth * |
| --- | --- | --- | --- | --- | --- | --- | --- | --- | --- | --- | --- | --- | --- | --- |
|  | Mw | PD | G | Na | M | E | O | Oem | Ohm | Oam | | | | |
| Ex. 1 | 10,250 | 2.03 |  | 40.0 |  | 40.4 | 19.6 |  |  |  | 76.9 | 31.0 | 64.8 | 7.3 |
| Ex. 2 | 10,610 | 2.07 |  | 40.2 |  | 40.3 |  |  | 19.5 |  | 78.1 | 29.0 | 66.5 | 7.1 |
| Ex. 3 | 10,980 | 2.11 |  | 40.4 |  | 40.2 |  |  |  | 19.4 | 79.3 | 27.1 | 68.3 | 6.9 |
| Ex. 4 | 9,630 | 1.78 | 39.8 |  | 40.1 |  |  | 20.1 |  |  | 77.3 | 30.9 | 65.1 | 7.2 |
| Ex. 5 | 9,960 | 1.82 | 40.0 |  | 40.0 |  |  |  | 20.0 |  | 78.5 | 28.9 | 66.8 | 7.0 |
| Ex. 6 | 10,310 | 1.85 | 40.2 |  | 39.9 |  |  |  |  | 19.9 | 79.7 | 27.0 | 68.6 | 6.9 |
| Comp. Ex. 1 | 11,630 | 1.95 |  | 40.3 |  | 40.5 | 19.2 |  |  |  | 71.2 | 43.2 | 57.6 | 7.8 |
| Comp. Ex. 2 | 9,030 | 1.92 |  | 49.7 |  | 50.3 |  |  |  |  | 75.8 | 40.4 | 61.4 | 7.7 |
| Comp. Ex. 3 | 11,160 | 1.98 |  | 39.8 |  | 40.7 | 19.4 |  |  |  | 70.5 | 43.7 | 57.1 | 7.9 |
| Comp. Ex. 4 | 10,280 | 1.78 | 51.2 |  | 48.8 |  |  |  |  |  | 77.0 | 39.7 | 62.3 | 7.6 |
| Comp. Ex. 5 | 10,210 | 1.79 | 40.7 |  | 49.5 |  | 9.8 |  |  |  | 74.9 | 41.0 | 60.6 | 7.7 |
| Comp. Ex. 6 | 10,480 | 1.74 | 39.6 |  | 40.4 |  | 20.0 |  |  |  | 70.8 | 43.5 | 57.3 | 7.8 |
| Comp. Ex. 7 | 7,090 | 1.78 | 42.2 |  | 37.3 |  | 20.5 |  |  |  | 69.4 | 44.3 | 56.2 | 7.7 |
| Comp. Ex. 8 | 10,160 | 1.82 | 41.2 |  |  | 39.1 | 19.7 |  |  |  | 73.1 | 42.1 | 59.2 | 7.9 |

As is clear from these data, a composition containing a copolymer which, when formed into a thin film, exhibits a falling angle of 35° or less or a sweepback angle of 64° or more exhibits small Eth (required minimum exposure); i.e., elution of a radiation-sensitive acid-generator into water is inhibited under immersion conditions. As is also clear from these data, a copolymer having the repeating unit (C) exhibits a falling angle of 35° or less or a sweepback angle of 64° or more when formed into a thin film, and a composition containing such a copolymer exhibits small Eth and is suitable for immersion lithography.

The invention claimed is:

1. A copolymer for immersion lithography, comprising:
a repeating unit (A) that generates an alkali-soluble group by removing a protecting group through action of an acid,
a repeating unit (B) having a lactone structure, and
a repeating unit (C) that generates an alcoholic hydroxyl group by removing a protecting group through action of an acid,
wherein, when a solution of the copolymer in propylene glycol monomethyl ether acetate is applied to a wafer and then heated to form a thin film, and a 15-μL droplet of pure water is added onto the thin film, the inclination of the wafer at the time when the water droplet starts to move is 35° or less,
wherein the repeating unit (C) has a structure represented by formula (C2):

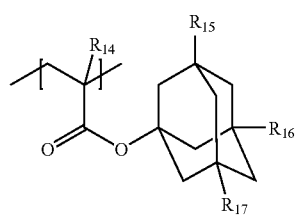

(C2)

wherein $R_{14}$ represents a hydrogen atom or a C1-C4 hydrocarbon group which may be substituted by a fluorine atom; $R_{15}$ to $R_{17}$ each represent a hydrogen atom, a hydroxyl group, or a substituent represented by formula (c1):

(c1)

wherein $R_{18}$ represents a C1-C15 hydrocarbon group; and at least one of $R_{15}$ to $R_{17}$ is a substituent represented by formula (c1).

2. The copolymer for immersion lithography according to claim 1, wherein the repeating unit (A) has a structure represented by formula (A1):

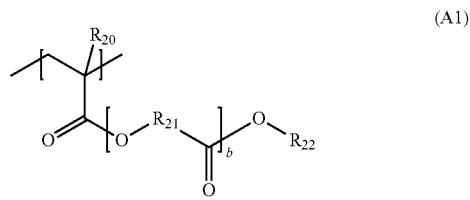

(A1)

wherein $R_{20}$ represents a hydrogen atom or a C1-C4 hydrocarbon group which may be substituted by a fluorine atom; $R_{21}$ represents a C6-C12 alicyclic hydrocarbon group which may include an oxygen atom or a sulfur atom; b is an integer of 0 or 1; and $R_{22}$ represents a substituent represented by formula (a1) or formula (a2):

(a1)

wherein $R_{23}$ and $R_{24}$ each independently represent a C1-C4 hydrocarbon group, and $R_{25}$ represents a C1-C12 hydrocarbon group or $R_{25}$ may be bonded to $R_{23}$ or $R_{24}$ to form a ring;

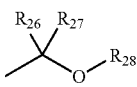

(a2)

wherein $R_{26}$ and $R_{27}$ each independently represent a hydrogen atom or a C1-C4 hydrocarbon group; $R_{28}$ represents a C1-C12 hydrocarbon group; and $R_{26}$ may be bonded to $R_{27}$ or $R_{28}$ to form a ring.

3. The copolymer for immersion lithography according to claim 1, wherein the repeating unit (B) has a structure represented by formula (B1):

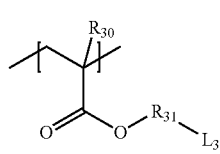

(B1)

wherein $R_{30}$ represents a hydrogen atom or a C1-C4 hydrocarbon group which may be substituted by a fluorine atom; $R_{31}$ represents a single bond or a C5-C12 alicyclic hydrocarbon group which may include an oxygen atom or a sulfur atom; $L_3$ represents a lactone structure represented by formula (b1) and is bonded to $R_{31}$ by one or two single bonds:

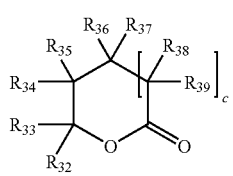

(b1)

wherein
any one of $R_{32}$ to $R_{39}$ represents a single bond having an $R_{31}$ binding site, and the remaining ones of $R_{32}$ to $R_{39}$ each represent a hydrogen atom or a C1-C4 hydrocarbon or alkoxy group; or
any one of $R_{32}$ to $R_{39}$ represents a C3-C12 hydrocarbon group which may include an oxygen atom or a sulfur atom, said hydrocarbon group having a binding site of $R_{31}$ and being bonded to any one or two of the remaining ones of $R_{32}$ to $R_{39}$ to form a C5-C15 alicyclic ring;
any one or two of the remaining ones of $R_{32}$ to $R_{39}$ represent a single bond for forming the C5-C15 alicyclic ring; and the further remaining ones of $R_{32}$ to $R_{39}$ each represent a hydrogen atom or a C1-C4 hydrocarbon or alkoxy group; and c is an integer of 0 or 1.

4. A composition for immersion lithography, comprising the copolymer according to claim 1, a radiation-sensitive acid-generator, and a solvent.

5. A copolymer for immersion lithography, comprising:
a repeating unit (A) that generates an alkali-soluble group by removing a protecting group through action of an acid,
a repeating unit (B) having a lactone structure, and
a repeating unit (C) that generates an alcoholic hydroxyl group by removing a protecting group through action of an acid,
wherein, when a solution of the copolymer in propylene glycol monomethyl ether acetate is applied to a wafer and then heated to form a thin film, and a 15-μL droplet of pure water is added onto the thin film, the contact angle of the top edge of the water droplet at the time when the water droplet starts to move is 64° or more,
wherein the repeating unit (C) has a structure represented by formula (C2):

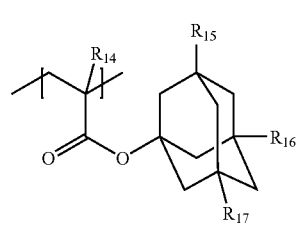

(C2)

wherein $R_{14}$ represents a hydrogen atom or a C1-C4 hydrocarbon group which may be substituted by a fluorine atom; $R_{15}$ to $R_{17}$ each represent a hydrogen atom, a hydroxyl group, or a substituent represented by formula (c1):

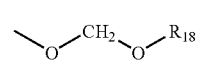

(c1)

wherein $R_{18}$ represents a C1-C15 hydrocarbon group; and at least one of $R_{15}$ to $R_{17}$ is a substituent represented by formula (c1).

6. The copolymer for immersion lithography according to claim 5, wherein the repeating unit (A) has a structure represented by formula (A1):

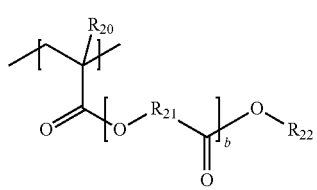

(A1)

wherein $R_{20}$ represents a hydrogen atom or a C1-C4 hydrocarbon group which may be substituted by a fluorine atom; $R_{21}$ represents a C6-C12 alicyclic hydrocarbon group which may include an oxygen atom or a sulfur atom; b is an integer of 0 or 1; and $R_{22}$ represents a substituent represented by formula (a1) or formula (a2):

(a1)

wherein $R_{23}$ and $R_{24}$ each independently represent a C1-C4 hydrocarbon group, and $R_{25}$ represents a C1-C12 hydrocarbon group or $R_{25}$ may be bonded to $R_{23}$ or $R_{24}$ to form a ring;

(a2)

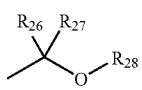

wherein $R_{26}$ and $R_{27}$ each independently represent a hydrogen atom or a C1-C4 hydrocarbon group; $R_{28}$ represents a C1-C12 hydrocarbon group; and $R_{26}$ may be bonded to $R_{27}$ or $R_{28}$ to form a ring.

7. The copolymer for immersion lithography according to claim 5, wherein the repeating unit (B) has a structure represented by formula (B1):

(B1)

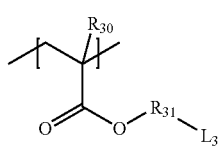

wherein $R_{30}$ represents a hydrogen atom or a C1-C4 hydrocarbon group which may be substituted by a fluorine atom; $R_{31}$ represents a single bond or a C5-C12 alicyclic hydrocarbon group which may include an oxygen atom or a sulfur atom; $L_3$ represents a lactone structure represented by formula (b1) and is bonded to $R_{31}$ by one or two single bonds:

(b1)

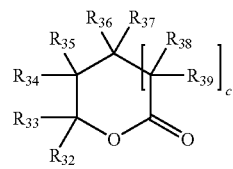

wherein
any one of $R_{32}$ to $R_{39}$ represents a single bond having an $R_{31}$ binding site, and the remaining ones of $R_{32}$ to $R_{39}$ each represent a hydrogen atom or a C1-C4 hydrocarbon or alkoxy group; or any one of $R_{32}$ to $R_{39}$ represents a C3-C12 hydrocarbon group which may include an oxygen atom or a sulfur atom, said hydrocarbon group having a binding site of $R_{31}$ and being bonded to any one or two of the remaining ones of $R_{32}$ to $R_{39}$ to form a C5-C15 alicyclic ring;

any one or two of the remaining ones of $R_{32}$ to $R_{39}$ represent a single bond for forming the C5-C15 alicyclic ring; and the further remaining ones of $R_{32}$ to $R_{39}$ each represent a hydrogen atom or a C1-C4 hydrocarbon or alkoxy group; and c is an integer of 0 or 1.

8. A composition for immersion lithography, comprising the copolymer according to claim 5, a radiation-sensitive acid-generator, and a solvent.

\* \* \* \* \*